United States Patent
Zhao et al.

(10) Patent No.: US 9,209,284 B2
(45) Date of Patent: Dec. 8, 2015

(54) TUNNELING FIELD EFFECT TRANSISTOR WITH NEW STRUCTURE AND PREPARATION METHOD THEREOF

(71) Applicant: Huawei Technologies Co., Ltd., Shenzhen (CN)

(72) Inventors: Jing Zhao, Shenzhen (CN); Xichao Yang, Shenzhen (CN); Chen-Xiong Zhang, Plano, TX (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/542,825

(22) Filed: Nov. 17, 2014

(65) Prior Publication Data

US 2015/0228768 A1 Aug. 13, 2015

(30) Foreign Application Priority Data

Feb. 8, 2014 (CN) .......................... 2014 1 0045496

(51) Int. Cl.
*H01L 29/66* (2006.01)
*H01L 29/08* (2006.01)

(52) U.S. Cl.
CPC ...... *H01L 29/66977* (2013.01); *H01L 29/0895* (2013.01); *H01L 29/66477* (2013.01)

(58) Field of Classification Search
CPC ............ H01L 29/0653; H01L 29/0657; H01L 29/0895; H01L 29/66356; H01L 29/66477; H01L 29/66977; H01L 29/78642; H01L 21/823418; H01L 21/823487; H01L 21/823885
See application file for complete search history.

(56) References Cited

PUBLICATIONS

Kim, S., "Design Improvement of L-shaped Tunneling Field-Effect Transistors", IEEE International SOI Conference (SOI), Oct. 1-4, 2012, 2 pages.
Morita, Y., "Synthetic electric field tunnel FETs: drain current multiplication demonstrated by wrapped gate electrode around ultrathin epitaxial channel", Symposium on VLSI Technology (VLSIT), Jun. 11-13, 2013, pp. 236-237.

*Primary Examiner* — Armando Rodriguez
(74) *Attorney, Agent, or Firm* — Conley Rose, P.C.; Grant Rodolph; William H. Dietrich

(57) ABSTRACT

A tunneling field effect transistor with a new structure and a preparation method thereof are provided. The tunneling field effect transistor includes an active region between a source and a drain, a gate dielectric layer, and a gate located on a side of the gate dielectric layer deviating from the source, and a tunneling region disposed between the gate dielectric layer and the source and in contact with both the gate dielectric layer and the source. The source includes at least a first area and a second area perpendicularly connected in an "L" shape. The tunneling region is in contact with at least the first area and the second area. The gate dielectric layer is in contact with at least the tunneling region and the source.

20 Claims, 22 Drawing Sheets

```
          CONT.
          FROM
          FIG. 8A
             ↓
```

| Perform heavy doping of N-type ions on the exposed area by means of ion implantation, and perform rapid annealing treatment, so as to form a drain 20 | — S106 |

| Remove the remaining third hard mask layer 706 and the silicon epitaxial layer 705 located on the first area 101; deposit a fourth hard mask layer 707 on the exposed first area 101, silicon epitaxial layer 705, and drain 20; and perform patterning processing on the fourth hard mask layer 707 to expose the silicon epitaxial layer 705 that is located directly over the second area 102 and is in an "L" shape | — S107 |

| Perform heavy doping or light doping of N-type ions, or skip performing doping on the exposed area, so as to form a tunneling region 60; in this case, the silicon epitaxial layer 705 and the second part 70b that are located between the source electrode 10 and the drain electrode 20 together form an active region 30; and then remove the remaining fourth hard mask layer 707 | — S108 |

| Prepare a gate dielectric layer 40 and a gate 50, and complete a subsequent process, such as metal contact, so as to form a complete tunneling field effect transistor | — S109 |

FIG. 8B

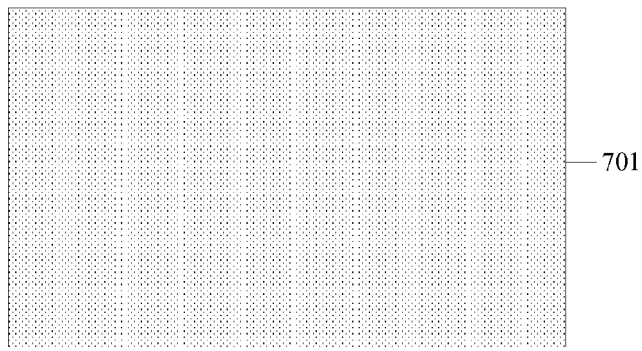

FIG. 9(a)

CONT.
FROM
FIG. 11A

↓

| Perform heavy doping of P-type ions on the exposed area by means of ion implantation, and perform rapid annealing treatment, so as to form a source 10 | — S306 |

↓

| Remove the remaining third hard mask layer 706; then epitaxially form a silicon epitaxial layer 705 with a thickness of about 5 nm, and etch to remove the silicon epitaxial layer 705 on a first area 101 and the drain 20 | — S307 |

↓

| Deposit a fourth hard mask layer 707 on the first area 101, the silicon epitaxial layer 705, and the drain 20; and perform patterning processing on the fourth hard mask layer 707 to expose the silicon epitaxial layer 705 that is located on a second area 102 and in an "L"-shape | — S308 |

↓

| Perform heavy doping or light doping of N-type ions, or skip performing doping on the exposed area, so as to form a tunneling region 60; in this case, the second part 70b and the silicon epitaxial layer 705 that are located between the source 10 and the drain 20 together form an active region 30; and then remove the remaining fourth hard mask layer 707 | — S309 |

↓

| Prepare a gate dielectric layer 40 and a gate electrode 50, and complete a subsequent process, such as metal contact, so as to form a complete tunneling field effect transistor | — S310 |

FIG. 11B

TUNNELING FIELD EFFECT TRANSISTOR WITH NEW STRUCTURE AND PREPARATION METHOD THEREOF

CROSS-REFERENCE TO RELATED APPLICATIONS

This application claims priority to Chinese Patent Application No. 201410045496.4, filed on Feb. 8, 2014, which is hereby incorporated by reference in its entirety.

TECHNICAL FIELD

The present invention relates to the field of semiconductor technologies, and in particular, to a tunneling field effect transistor with a new structure and a preparation method thereof.

BACKGROUND

In order to continuously improve performance of super large-scale integrated circuits, a feature size of a complementary metal oxide semiconductor (CMOS) device decreases continuously. However, when the size of the device decreases to deep sub-micron, a short-channel effect (SCE) on a sub-threshold characteristic and the like is more obvious, which has become a main bottleneck that limits a decrease of the size of the device. In view of the foregoing problem, not only a new structure and a new material may be used to inhibit an SCE of a metal oxide semiconductor field effect transistor (MOSFET), an impact on the SCE may also be reduced by changing a working mechanism of the MOSFET, for example, a tunneling field effect transistor (TFET). Because injection of carriers at a source end of the TFET is based on a tunneling mechanism, a smaller subthreshold swing (SS) can be obtained, thereby satisfying a low power consumption application. In addition, because of a change in an injection manner of the carriers at the source end, the TFET can exhibit a better short-channel effect inhibiting capability, which facilitates improving an integration level of the device, and reducing production costs.

In the prior art, on the one hand, as shown in FIG. 1, a part of a tunneling region 60 is added between a source 10 and a gate dielectric layer 40, thereby increasing a tunneling area to increase a tunneling current. However, there is a limitation to the tunneling area of a TFET with this structure, and if the tunneling area needs to be increased, an integration area or an SS value of the transistor may increase. On the other hand, as shown in FIG. 2, a new electric field is combined by controlling an epitaxial layer and a multi-gate structure, thereby increasing an electron tunneling probability to increase a tunneling current. Although a tunneling probability of a TFET with this structure is increased, a tunneling area is not large. If the tunneling area needs to be increased, an increase of an integration area or an increase of an SS value of the transistor is caused.

SUMMARY

Embodiments of the present invention provide a tunneling field effect transistor with a new structure and a preparation method thereof, which can increase a tunneling area and increase a tunneling probability, thereby increasing a conduction current of a transistor and obtaining a steep subthreshold slope.

To achieve the foregoing objectives, the following technical solutions are adopted in the embodiments of the present invention.

According to a first aspect, a tunneling field effect transistor includes an active region between a source and a drain, a gate dielectric layer, and a gate located on a side of the gate dielectric layer deviating from the source. The tunneling region is disposed between the gate dielectric layer and the source and in contact with both the gate dielectric layer and the source, where the source includes at least a first area and a second area that are perpendicularly connected in an "L" shape. The tunneling region is in contact with at least the first area and the second area, and the gate dielectric layer is in contact with at least the tunneling region.

In a first possible implementation manner of the first aspect, both ends of the tunneling region are aligned with both ends of the source.

With reference to the first possible implementation manner of the first aspect, in a second possible implementation manner, the source includes the first area and the second area, where the second area is in contact with the active region, and where, along a direction perpendicular to a direction from the source towards the drain, a thickness of the active region is equal to a sum of a thickness of the second area and a thickness of the tunneling region in contact with the second area.

With reference to the second possible implementation manner of the first aspect, in a third possible implementation manner, a thickness of the drain is greater than or equal to the thickness of the active region.

With reference to the first possible implementation manner of the first aspect, in a fourth possible implementation manner, the source further includes a third area perpendicularly connected to the second area in an "L" shape and disposed on a same side as the first area, and where the active region is located between the drain and the third area, and the gate dielectric layer is further in contact with the active region and the drain.

With reference to the fourth possible implementation manner of the first aspect, in a fifth possible implementation manner, along a direction perpendicular to a direction from the source towards the drain, a thickness of the active region is equal to a sum of a thickness of the third area and a thickness of the tunneling region in contact with the third area.

With reference to the first five possible implementation manners of the first aspect, in a sixth possible implementation manner, a thickness of the tunneling region is less than 10 nanometers (nm).

In a seventh possible implementation manner of the first aspect, the tunneling field effect transistor is an N-type tunneling field effect transistor, the source is heavy doped of P-type ions, the drain is heavy doped of N-type ions, and the tunneling region is heavy doped of N-type ions, light doped of N-type ions, or of no ion doping, or the tunneling field effect transistor is a P-type tunneling field effect transistor, where the source is heavy doped of N-type ions, the drain is heavy doped of P-type ions, and the tunneling region is heavy doped of P-type ions, light doped of P-type ions, or of no ion doping.

With reference to the seventh possible implementation manner of the first aspect, in an eighth possible implementation manner, ion doping concentrations of different areas of the tunneling region are the same or not exactly the same, where an ion doping concentration of the tunneling region is light doping, heavy doping, or undoping when the ion doping concentrations of the different areas of the tunneling region are the same, and the ion doping concentrations of the different areas are selected from at least two of light doping, heavy doping, and undoping when the ion doping concentrations of the different areas of the tunneling region are not exactly the same.

With reference to the seventh possible implementation manner of the first aspect, in a ninth possible implementation manner, the P-type ions include at least one of boron ions, gallium ions, and indium ions, and the N-type ions include at least one of phosphorus ions and arsenic ions.

According to a second aspect, a preparation method of a tunneling field effect transistor is provided, where the method includes providing a substrate, forming, on the substrate, an active region between a source and a drain, where the source includes at least a first area and a second area perpendicularly connected in an "L" shape, forming a gate dielectric layer and a gate at least on the second area, where the gate is located on a side of the gate dielectric layer deviating from the source, and forming, between the gate dielectric layer and the source, a tunneling region in contact with both the gate dielectric layer and the source, where the tunneling region is in contact with at least the first area and the second area.

In a first possible implementation manner of the second aspect, both ends of the tunneling region are aligned with both ends of the source.

With reference to the first possible implementation manner of the second aspect, in a second possible implementation manner, the source includes the first area and the second area, where the second area is in contact with the active region, and where forming the active region, the source, the drain, and the tunneling region on the substrate includes etching the substrate to form an "L"-shaped substrate, where the "L"-shaped substrate includes three parts, where a second part is located between a first part and a third part, the first part corresponds to the source to be formed, the second part corresponds to the active region to be formed, and the third part corresponds to the drain to be formed, performing ion implantation on the first part to form the source, where the source includes the first area and the second area perpendicularly connected in an "L" shape, and the second area is in contact with the second part, after forming the source, forming an epitaxial layer on the "L"-shaped substrate, performing ion implantation on the third part and the epitaxial layer located directly over the third part to form the drain, after forming the drain, etching to remove the epitaxial layer located directly over the first area, and performing ion implantation or skipping performing ion implantation on the epitaxial layer located directly over the second area to form the tunneling region, and forming the active region with the second part and the epitaxial layer located directly over the second part.

With reference to the first possible implementation manner of the second aspect, in a third possible implementation manner, the source includes the first area and the second area, where the second area is in contact with the active region, and forming the active region, the source, the drain, and the tunneling region on the substrate includes etching the substrate to form an "L"-shaped substrate, where the "L"-shaped substrate includes three parts, where a second part is located between a first part and a third part, the first part corresponds to the source to be formed, the second part corresponds to the active region to be formed, and the third part corresponds to the drain to be formed, performing ion implantation on the first part to form the source and an ion implantation region, where the source includes the first area and the second area perpendicularly connected in an "L" shape, the second area is in contact with the second part, and the ion implantation region is in an "L" shape and located on an inner side of the "L"-shaped source, performing ion implantation on the ion implantation region to form the tunneling region, after forming the tunneling region, performing ion implantation on the third part to form the drain, and forming the active region with the second part.

With reference to the first possible implementation manner of the second aspect, in a fourth possible implementation manner, the source includes the first area and the second area, where the second area is in contact with the active region, and forming the active region, the source, the drain, and the tunneling region on the substrate includes performing ion implantation on the substrate corresponding to the drain to be formed to form the drain, after forming the drain, etching other parts of the substrate except the drain to form an "L"-shaped substrate, where the "L"-shaped substrate includes two parts, where a second part is located between a first part and the drain, the first part corresponds to the source to be formed, and the second part corresponds to the active region to be formed, performing ion implantation on the first part to form the source, where the source includes the first area and the second area perpendicularly connected in an "L" shape, and the second area is in contact with the second part, after forming the source, forming an epitaxial layer on the substrate, and etching to remove the epitaxial layer on the first area and the drain, performing ion implantation or skipping performing ion implantation on the epitaxial layer directly over the second area to form the tunneling region, and forming the active region with the second part and the epitaxial layer located directly over the second part.

With reference to the first possible implementation manner of the second aspect, in a fifth possible implementation manner, the source includes the first area, the second area, and a third area, where the third area is in contact with the active region, where forming the active region, the source, the drain, and the tunneling region on the substrate includes etching the substrate to form a "U"-shaped substrate, where the "U"-shaped substrate includes three parts, where a second part is located between a first part and a third part, the first part corresponds to the source to be formed, the second part corresponds to the active region to be formed, and the third part corresponds to the drain to be formed, performing ion implantation on the first part to form the source, where the source includes the first area, the second area, and the third area, where the third area is in contact with the second part, and both the first area and the second area, and where the second area and the third area are perpendicularly connected in an "L" shape, after forming the source, forming an epitaxial layer on the "U"-shaped substrate, performing ion implantation or skipping performing ion implantation on the epitaxial layer located directly over the second area and aligned with the source to form the tunneling region, after forming the tunneling region, etching to remove the epitaxial layer on the first area of the source, and performing ion implantation on the third part and the epitaxial layer in contact with the third part to form the drain, and forming the active region with the second part and the epitaxial layer corresponding to the second part.

With reference to the first five possible implementation manners of the second aspect, in a sixth possible implementation manner, a thickness of the tunneling region is less than 10 nm.

In a seventh possible implementation manner of the second aspect, the source is heavy doped of P-type ions, the drain is heavy doped of N-type ions, and the tunneling region is heavy doped of N-type ions, light doped of N-type ions, or of no ion doping when the tunneling field effect transistor is an N-type tunneling field effect transistor, and the drain is heavy doped of P-type ions, and the tunneling region is heavy doped of P-type ions, light doped of P-type ions, or of no ion doping when the tunneling field effect transistor is a P-type tunneling field effect transistor, the source is heavy doped of N-type ions.

With reference to the seventh possible implementation manner of the second aspect, in an eighth possible implementation manner, ion doping concentrations of different areas of the tunneling region are the same or not exactly the same, where an ion doping concentration of the tunneling region is light doping, heavy doping, or undoping when the ion doping concentrations of the different areas of the tunneling region are the same, and the ion doping concentrations of the different areas are selected from at least two of light doping, heavy doping, and undoping when the ion doping concentrations of the different areas of the tunneling region are not exactly the same.

With reference to the seventh possible implementation manner of the second aspect, in a ninth possible implementation manner, the P-type ions include at least one of boron ions, gallium ions, and indium ions, and the N-type ions include at least one of phosphorus ions and arsenic ions.

The embodiments of the present invention provide a tunneling field effect transistor with a new structure and a preparation method thereof. The tunneling field effect transistor includes a source and a drain, respectively, located on two sides of an active region, a gate dielectric layer, and a gate located on a side of the gate dielectric layer deviating from the source, and further includes a tunneling region disposed between the gate dielectric layer and the source and in contact with both the gate dielectric layer and the source. The source includes at least a first area and a second area perpendicularly connected in an "L" shape. The tunneling region is in contact with at least the first area and the second area, and the gate dielectric layer is in contact with at least the tunneling region.

As may be known based on the foregoing description, the source is set to an irregular shape and the tunneling region is enabled to be in full contact with the source, which may effectively increase a tunneling area. Meanwhile, because the first area and the second area are perpendicularly connected in an "L" shape, a new electric field may be combined at least at an intersection of the first area and the second area, thereby increasing an electron tunneling probability. In the foregoing two manners, a tunneling current can be effectively increased. In this case, when the tunneling field effect transistor operates, a relatively small external voltage is applied to an electrode of the transistor to obtain a relatively large conduction current, thereby obtaining a steep subthreshold slope. In addition, when the tunneling area is increased, an integration area and a channel length of the transistor are not increased, thereby ensuring performance of the transistor.

BRIEF DESCRIPTION OF DRAWINGS

To describe the technical solutions in the embodiments of the present invention or in the prior art more clearly, the following briefly introduces the accompanying drawings required for describing the embodiments or the prior art. The accompanying drawings in the following description show some embodiments of the present invention, and persons of ordinary skill in the art may still derive other drawings from these accompanying drawings without creative efforts.

FIG. 8A and FIG. 8B show a flowchart 1 of preparing a tunneling field effect transistor according to an embodiment of the present invention.

FIG. 9(a) to FIG. 9(l) are a schematic diagram 1 and a schematic diagram 2 of a preparation process of a tunneling field effect transistor according to an embodiment of the present invention.

FIG. 11A and FIG. 11B show a flowchart 3 of preparing a tunneling field effect transistor according to an embodiment of the present invention.

REFERENCE NUMERALS

Figure 1:
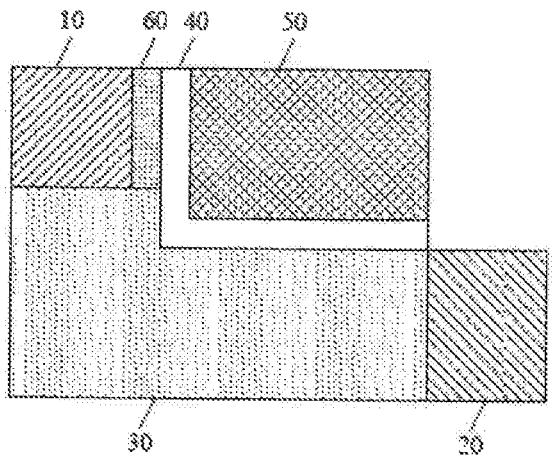
FIG. 1 is a schematic structural diagram 1 of a tunneling field effect transistor in the prior art.
Figure 2:
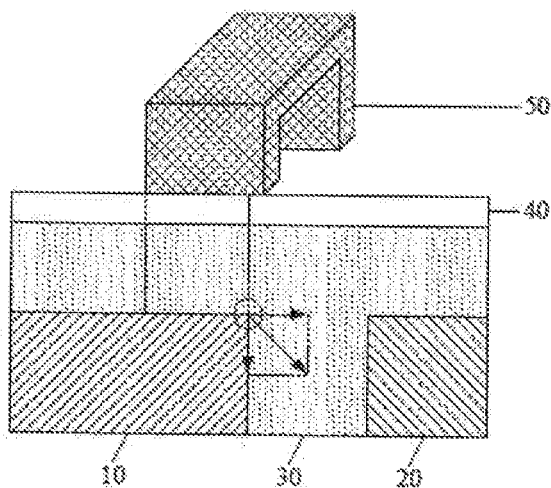
FIG. 2 is a schematic structural diagram 2 of a tunneling field effect transistor in the prior art.

10—source; 101—first area; 102—second area; 103—third area; 20—drain; 30—active region; 40—gate dielectric layer; 50—gate; 60—tunneling region; 70—substrate; 70a—first part; 70b—second part; 70c—third part; 701—silicon substrate; 702—sacrificial layer; 703—first hard mask layer; 704—second hard mask layer; 705—silicon epitaxial layer; 706—third hard mask layer; and 707—fourth hard mask layer.

DESCRIPTION OF EMBODIMENTS

The following clearly describes the technical solutions in the embodiments of the present invention with reference to the accompanying drawings in the embodiments of the present invention. The described embodiments are a part rather than all of the embodiments of the present invention. All other embodiments obtained by persons of ordinary skill in the art based on the embodiments of the present invention without creative efforts shall fall within the protection scope of the present invention.

An embodiment of the present invention provides a tunneling field effect transistor with a new structure. As shown in FIG. 3 to FIG. 7, the tunneling field effect transistor includes a source 10 and a drain 20 respectively located on two sides of an active region 30, a gate dielectric layer 40, and a gate 50 that is located on a side of the gate dielectric layer 40 deviating from the source 10, and further includes a tunneling region 60 that is disposed between the gate dielectric layer 40 and the source 10 and is in contact with both the gate dielectric layer 40 and the source 10. The source 10 includes at least a first area 101 and a second area 102 that are perpendicularly connected in an "L" shape. The tunneling region 60 is in contact with at least the first area 101 and the second area 102 and the gate dielectric layer 40 is in contact with at least the tunneling region 60.

The tunneling field effect transistor includes a P-type tunneling field effect transistor (PTFET) and an N-type tunneling field effect transistor (NTFET). For the NTFET, the drain 20 is heavy doped of N-type ions, and a forward bias voltage is applied when the NTFET works, and the source 10 is heavy doped of P-type ions, and a negative bias voltage is applied when the NTFET works. For the PTFET, the drain 20 is heavy doped of P-type ions, and a negative bias voltage is applied when the PTFET works, and the source 10 is heavy doped of N-type ions, and a forward bias voltage is applied when the PTFET works. On this basis, a doping type of the tunneling region 60 may be consistent with a doping type of the drain 20, or doping is not performed.

Herein, when the tunneling field effect transistor is an NTFET, a forward bias voltage applied to the drain 20 and a negative bias voltage applied to the source 10 is used as an example to describe a working principle of the tunneling field effect transistor. Under an action of an electric field of the gate 50, there is an energy band difference between a valence band of the source 10 and a conduction band of the tunneling region 60. In this case, electrons in the valence band of the source 10 tunnels to the conduction band of the tunneling region 60 to form a tunneling current. In this case, the tunneled electrons are concentrated on a contact surface of the gate dielectric layer 40 and the tunneling region 60. Under an action of a drain-source voltage, these tunneled electrons flow to the drain 20 to form a drain current, that is, a working current of the transistor.

It should be noted that first, the tunneling region 60 is disposed between the source 10 and the gate dielectric layer 40 and is used to increase, when the tunneling field effect transistor works, a tunneling current formed by electron tunneling.

Second, a substrate of the tunneling field effect transistor may be any one of silicon, germanium, a binary or ternary compound semiconductor, such as silicon germanium and gallium arsenide, in the group II-IV, the group III-V, or the group IV-IV, semiconductor on Insulator or silicon on an insulated substrate (SOI), or germanium on an insulated substrate.

A silicon substrate or a germanium substrate is used as an example for description in all the accompanying drawings in the embodiments of the present invention. If the substrate is replaced with an SOI substrate, an insulated part of the SOI substrate also needs to be reflected. The SOI substrate may be implemented by using a method, such as a local oxidation of silicon (LOCOS) process or a mesa process.

Third, that the gate dielectric layer 40 is in contact with at least the tunneling region 60 refers to if there is an overlapping area between the gate 50 and the tunneling region 60, the gate dielectric layer 40 is in contact with the tunneling region 60, if there are overlapping areas between the gate 50 and the tunneling region 60 and between the gate 50 and the active region 30, the gate dielectric layer 40 is in contact with the tunneling region 60 and the active region 30, and if there are overlapping areas between the gate 50 and the tunneling region 60, between the gate 50 and the active region 30, and between the gate 50 and the drain 20, the gate dielectric layer 40 is in contact with the tunneling region 60, the active region 30, and the drain 20, and so on.

Fourth, in order to increase a tunneling area, a contact area between the source 10 and the tunneling region 60 may be increased. An increase of the contact area between the source 10 and the tunneling region 60 may be implemented by increasing a respective area of the source 10 and the tunneling region 60 so as to enable the source 10 to be in full contact with the tunneling region 60.

Based on the foregoing description, the source 10 may include at least the first area 101 and the second area 102 that are perpendicularly connected in an "L" shape. The tunneling region 60 may be in contact with at least both the first area 101 and the second area 102, and on this basis, the tunneling region 60 may further be in contact with another part, for example, the active region 30, of the transistor definitely.

An embodiment of the present invention provides a tunneling field effect transistor, including a source 10 and a drain 20 respectively located on two sides of an active region 30, a gate dielectric layer 40, and a gate 50 that is located on a side of the gate dielectric layer 40 deviating from the source 10, and further including a tunneling region 60 that is disposed between the gate dielectric layer 40 and the source 10 and is in contact with both the gate dielectric layer 40 and the source 10; the source 10 includes at least a first area 101 and a second area 102 that are perpendicularly connected in an "L" shape. The tunneling region 60 is in contact with at least the first area 101 and the second area 102 and the gate dielectric layer 40 is in contact with at least the tunneling region 60.

As may be known based on the foregoing description, the source 10 is set to an irregular shape, and the tunneling region 60 is enabled to be in full contact with the source 10, which may effectively increase a tunneling area. Meanwhile, because the first area 101 and the second area 102 are perpendicularly connected in an "L" shape, a new electric field may be combined at least at an intersection of the first area 101 and the second area 102, thereby increasing an electron tunneling probability. In the foregoing two manners a tunneling current can be effectively increased. In this case, when the tunneling field effect transistor works, a relatively small external voltage needs to be applied to an electrode of the transistor, then the transistor may obtain a relatively large conduction current, thereby obtaining a steep subthreshold slope. In addition, when the tunneling area is increased, it may also be ensured that an integration area and a channel length of the transistor are not increased, thereby ensuring performance of the transistor.

Because an electron tunneling phenomenon mostly occurs between the source 10 and the tunneling region 60, an increase of the tunneling area may be implemented by increasing a contact area between the source 10 and the tunneling region 60. Therefore, preferably, referring to FIG. 3 to FIG. 7, both ends of the tunneling region 60 are aligned with both ends of the source 10.

In this case, the tunneling region 60 may implement full contact with the source 10, which can effectively increase the tunneling area, and can improve an integration level of the tunneling field effect transistor and reduce an integration area.

Optionally, referring to FIG. 3 to FIG. 6, the source 10 includes the first area 101 and the second area 102, and the second area 102 is in contact with the active region 30, and along a direction perpendicular to a direction from the source 10 towards the drain 20, a thickness of the active region 30 is equal to a sum of a thickness of the second area 102 and a thickness of the tunneling region 60 in contact with the second area 102.

Herein, the direction from the source 10 towards the drain 20 is a movement direction of a carrier in a formed channel when the transistor works.

Figure 3:
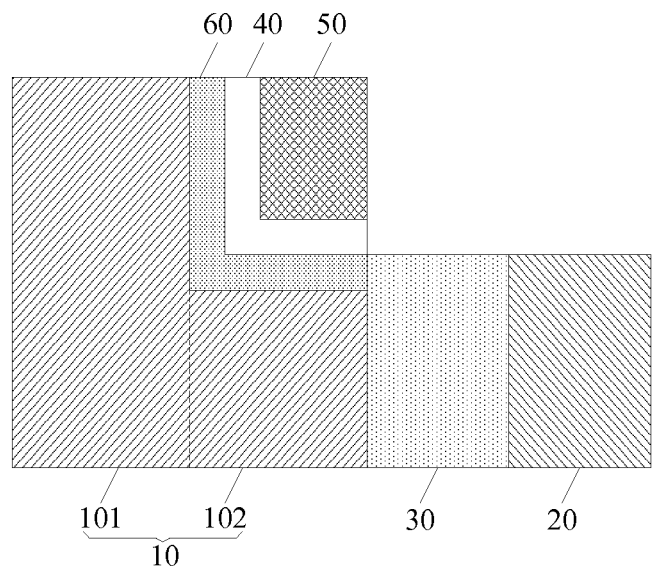
FIG. 3 is a schematic structural diagram 1 of a tunneling field effect transistor according to an embodiment of the present invention.
Figure 4:
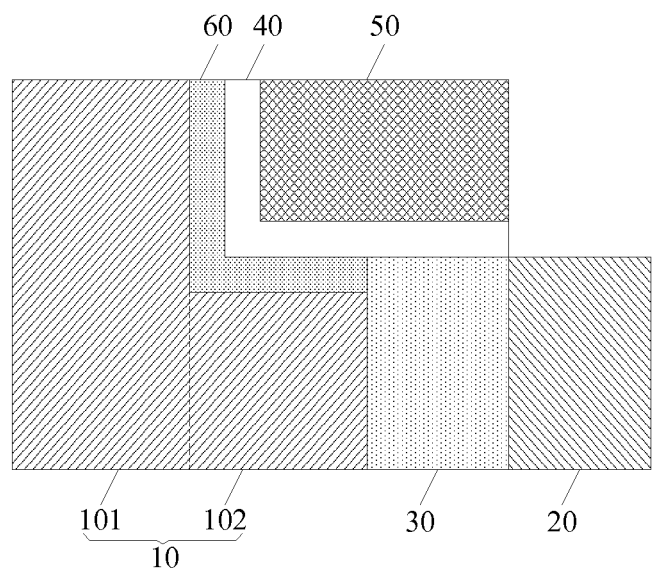
FIG. 4 is a schematic structural diagram 2 of a tunneling field effect transistor according to an embodiment of the present invention.
Figure 5:
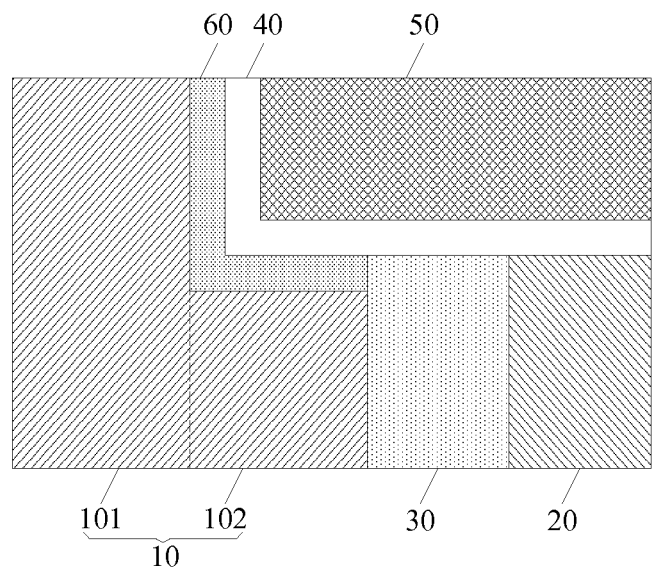
FIG. 5 is a schematic structural diagram 3 of a tunneling field effect transistor according to an embodiment of the present invention.

Further, referring to FIG. 3 to FIG. 5, a thickness of the drain 20 may be consistent with the thickness of the active region 30. Alternatively, referring to FIG. 6, a thickness of the drain 20 may be greater than the thickness of the active region 30. Definitely, the thickness of the drain 20 may also be less than the thickness of the active region 30. An actual thickness of the drain 20 is not specifically limited in this embodiment of the present invention, but the thickness of the drain 20 should be properly set on a basis of simplifying a preparation process.

On this basis, preferably, the thickness of the drain 20 is greater than or equal to the thickness of the active region 30. In this case, in a preparation process of the tunneling field effect transistor, ion doping may be performed on a corresponding position of the drain 20 by directly blocking a mask layer, so as to form the drain 20.

Figure 7:
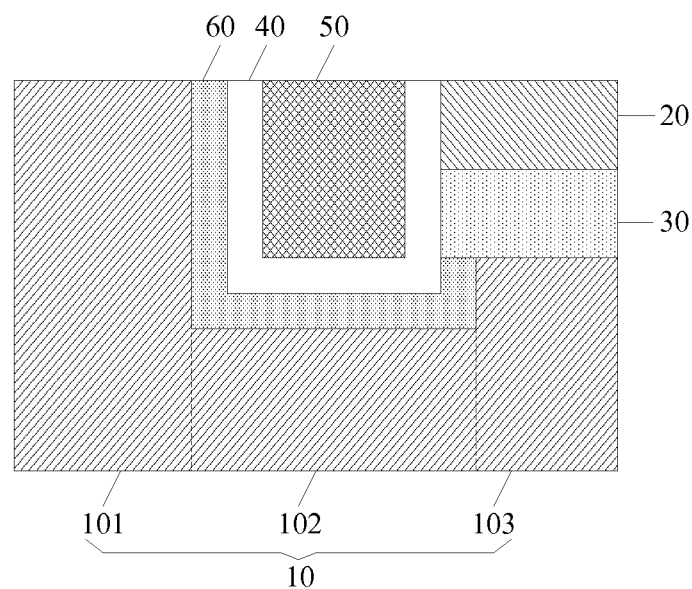
FIG. 7 is a schematic structural diagram 5 of a tunneling field effect transistor according to an embodiment of the present invention.

Optionally, referring to FIG. 7, the source 10 may further include a third area 103 that is perpendicularly connected to the second area 102 in an "L" shape and is disposed on a same side as the first area 101, where the active region 30 is located between the drain 20 and the third area 103, and the gate dielectric layer 40 is also in contact with the active region 30 and the drain 20.

Along a direction perpendicular to a direction from the source 10 towards the drain 20, a thickness of the active region 30 is equal to a sum of a thickness of the third area 103 and a thickness of the tunneling region 60 in contact with the third area 103.

The direction from the source 10 towards the drain 20 herein is a movement direction of a carrier in a formed channel when the transistor works.

Further, referring to FIG. 7, both the first area 101 and the third area 103 are perpendicular to the second area 102 and located on a same side of the second area 102, and the active region 30 is located between the drain 20 and the third area 103. In order to facilitate preparation of the active region 30 and the drain 20, along the direction from the source 10 towards the drain 20, a length of the third area 103 is preferably less than a length of the first area 101, that is, an area of the first area 101 may completely cover and is greater than a projection area of the third area 103 on the first area 101. In this case, the active region 30 and the drain 20 may be disposed on an empty part of the third area 103 relative to the first area 101. In this case, the area of the first area 101 may completely cover and is greater than or equal to a projection area of the third area 103, the active region 30, and the drain 20 on the first area 101.

As may be known based on the foregoing description, the tunneling field effect transistor may be an N-type tunneling field effect transistor, where the source 10 is heavy doped of P-type ions, the drain 20 is heavy doped of N-type ions, and the tunneling region 60 is heavy doped or light doped of N-type ions, or of no ion doping, or the tunneling field effect transistor is a P-type tunneling field effect transistor, where the source 10 is heavy doped of N-type ions, the drain 20 is heavy doped of P-type ions, and the tunneling region 60 is heavy doped or light doped of P-type ions, or of no ion doping.

Herein, the P-type ions may include at least one of boron ions, gallium ions, or indium ions, and the N-type ions may include at least one of phosphorus ions or arsenic ions.

Based on this, further, in order to facilitate generation of an electron tunneling effect, a thickness of the tunneling region 60 is preferably less than 10 nm.

On this basis, ion doping concentrations of different areas of the tunneling region 60 are the same or not exactly the same, where if the ion doping concentrations of the different areas of the tunneling region are the same, an ion doping concentration of the tunneling region 60 may be light doping, heavy doping, or undoping, and if the ion doping concentrations of the different areas of the tunneling region 60 are not exactly the same, the ion doping concentrations of the different areas may be selected from at least two of light doping, heavy doping, or undoping.

An ion concentration range for the heavy doping is $e^{19}$-$e^{21}$ centimeters $(cm)^{-3}$, an ion concentration range for the light doping concentration is $e^{17}$-$e^{18}$ $cm^{-3}$, and an ion concentration for the undoping is the same as a concentration of the substrate.

An embodiment of the present invention further provides a preparation method of a tunneling field effect transistor, where the method includes providing a substrate 70, forming, on the substrate 70, an active region 30 and a source 10 and a drain 20 respectively located on two sides of the active region 30, where the source 10 includes at least a first area 101 and a second area 102 that are perpendicularly connected in an "L" shape, forming a gate dielectric layer 40 and a gate 50 on at least the second area 102, where the gate 50 is located on a side of the gate dielectric layer 40 deviating from the source, and forming, between the gate dielectric layer 40 and the source 10, a tunneling region 60 in contact with both the gate dielectric layer 40 and the source 10, where the tunneling region 60 is in contact with at least the first area 101 and the second area 102.

Herein, the substrate 70 may be any one of silicon, germanium, a binary or ternary compound semiconductor, such as silicon germanium and gallium arsenide, in the group II-IV, the group III-V, or the group IV-IV, SOI, or germanium on an insulated substrate. A silicon substrate or a germanium substrate is used as an example for description in this embodiment of the present invention.

In order to facilitate generation of electron tunneling, a thickness of the tunneling region 60 is preferably less than 10 nm.

Based on the foregoing description, when the source 10 and the drain 20 are formed, or when the source 10, the drain 20, and the tunneling region 60 are formed, ion implantation needs to be performed. If the tunneling field effect transistor is an N-type tunneling field effect transistor, the source 10 is heavy doped of P-type ions, the drain 20 is heavy doped of N-type ions, and the tunneling region 60 is heavy doped or light doped of N-type ions, or of no ion doping, and if the tunneling field effect transistor is a P-type tunneling field effect transistor, the source is heavy doped of N-type ions, the drain is heavy doped of P-type ions, and the tunneling region is heavy doped or light doped of P-type ions, or of no ion doping.

On this basis, the P-type ions may include at least one of boron ions, gallium ions, or indium ions, and the N-type ions may include at least one of phosphorus ions or arsenic ions.

When the tunneling region 60 performs ion doping, ion doping concentrations of different areas of the tunneling region 60 may be the same or not exactly the same, where if the ion doping concentrations of the different areas of the tunneling region 60 are the same, an ion doping concentration of the tunneling region 60 is light doping, heavy doping, or undoping, and if the ion doping concentrations of the different areas of the tunneling region 60 are not exactly the same, the ion doping concentrations of the different areas are selected from at least two of light doping, heavy doping, or undoping.

An ion concentration range for the heavy doping is $e^{19}$-$e^{21}$ $cm^{-3}$, an ion concentration range for the light doping concentration is e17-e18 cm$^{-3}$, and an ion concentration for the undoping is the same as a concentration of a substrate.

Because an electron tunneling phenomenon mostly occurs between the source 10 and the tunneling region 60, and complexity of a preparation process is considered, preferably, both ends of the tunneling region 60 are aligned with both ends of the source 10.

In this case, the tunneling region 60 may implement full contact with the source 10, which can effectively increase a tunneling area, and can improve an integration level of the tunneling field effect transistor and reduce an integration area.

On this basis, optionally, referring to FIG. 3 to FIG. 5, the source 10 includes the first area 101 and the second area 102, and the second area 102 is in contact with the active region 30.

Further, forming the active region 30, the source 10, the drain 20, and the tunneling region 60 on the substrate may include etching the substrate 70 to form an "L"-shaped substrate, where the "L"-shaped substrate includes three parts, and the second part 70b is located between the first part 70a and the third part 70c, and the first part 70a corresponds to the source to be formed 10, the second part 70b corresponds to the active region to be formed 30, and the third part 70c corresponds to the drain to be formed 20, performing ion implantation on the first part 70a to form the source 10, where the source 10 includes the first area 101 and the second area 102 that are perpendicularly connected in an "L" shape, and the second area 102 is in contact with the second part 70b, after forming the source 10, forming an epitaxial layer 705 on the "L"-shaped substrate, performing ion implantation on the third part 70c and the epitaxial layer 705 located directly over the third part 70c to form the drain 20, after forming the drain 20, etching to remove the epitaxial layer 705 located directly over the first area 101, and performing ion implantation or skipping performing ion implantation on the epitaxial layer 705 located directly over the second area 102 to form the tunneling region 60, and forming the active region 30 with the second part 70b and the epitaxial layer 705 located directly over the second part 70b.

Figure 8A:
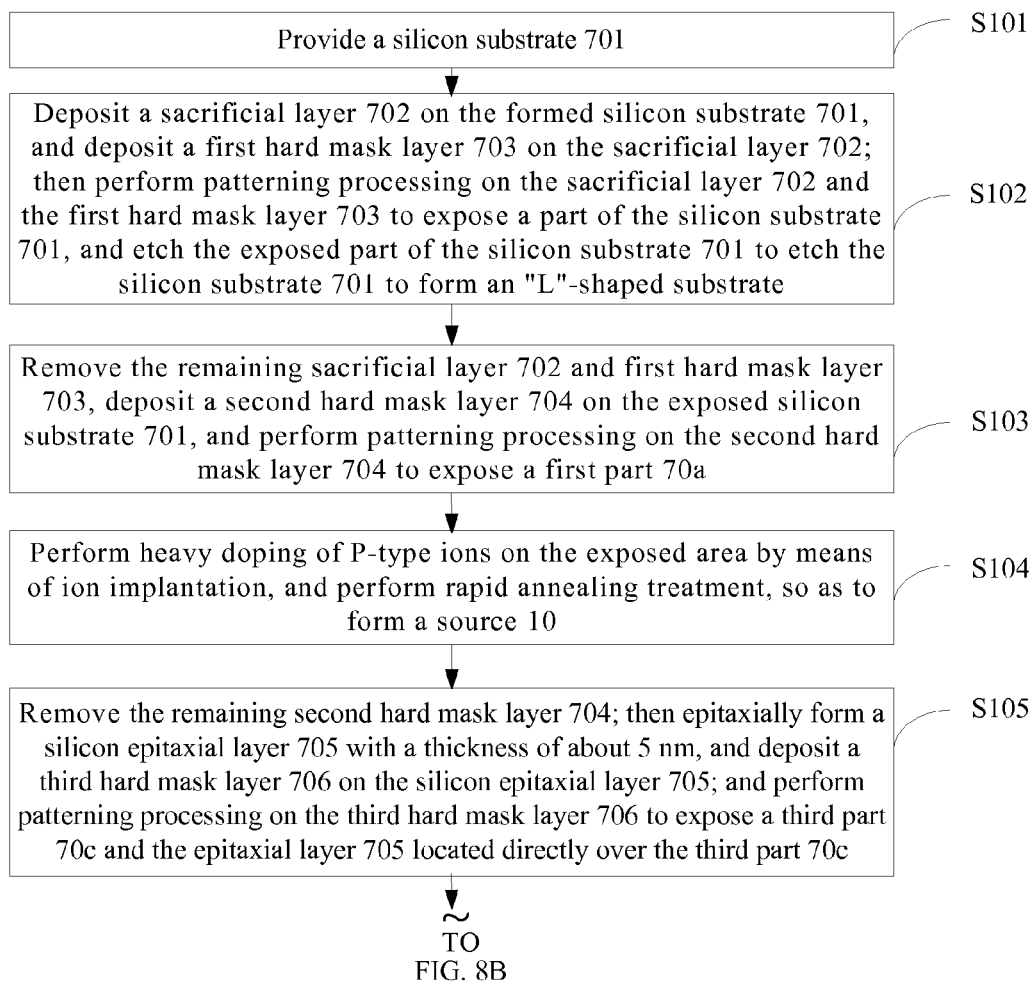

The following provides a specific Embodiment 1 for describing a preparation process of the tunneling field effect transistor as shown in FIG. 3 to FIG. 5. As shown in FIG. 8A and FIG. 8B, preparation of the tunneling field effect transistor may include the following steps.

S101. As shown in FIG. 9(a), provide a silicon substrate 701.

The silicon substrate 701 may be a rectangular substrate.

The silicon substrate 701 may perform light doping herein, and a P-well substrate, an N-well substrate, or a twin-well substrate may be formed by means of doping.

Figure 9B:
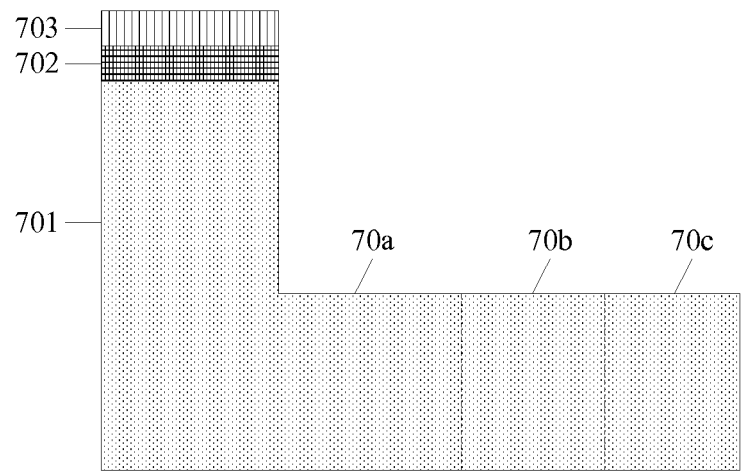

S102. As shown in FIG. 9(b), deposit a sacrificial layer 702 on the formed silicon substrate 701, and deposit a first hard mask layer 703 on the sacrificial layer 702, then perform patterning processing on the sacrificial layer 702 and the first hard mask layer 703 to expose a part of the silicon substrate 701, and etch the exposed part of the silicon substrate 701 to etch the silicon substrate 701 to form an "L"-shaped substrate.

The "L"-shaped substrate includes three parts, and the second part 70b is located between the first part 70a and the third part 70c, and the first part 70a corresponds to a source to be formed 10, the second part 70b corresponds to an active region to be formed 30, and the third part 70c corresponds to a drain to be formed 20.

Herein, the sacrificial layer 702 and the hard mask layer that are remained after patterning processing are located on the first pattern.

Herein, the sacrificial layer 702 and the hard mask layer may be implemented by using a process, such as low pressure chemical vapor deposition (LPCVD) or physical vapor deposition (PVD). The hard mask layer may use a silicon oxide material, a silicon nitride material, a silicon oxynitride material, or the like. The sacrificial layer 702 can be regarded as a protective layer. When the hard mask layer is etched, the sacrificial layer 702 may prevent the silicon substrate 701 from being affected by an etching solution and planarize a surface of the silicon substrate 701.

Figure 9C:
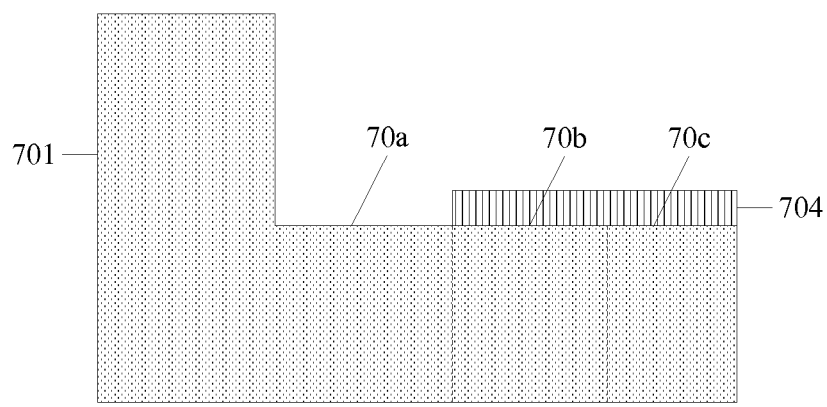

S103. As shown in FIG. 9(c), remove the remaining sacrificial layer 702 and first hard mask layer 703, deposit a second hard mask layer 704 on the exposed silicon substrate 701, and perform patterning processing on the second hard mask layer 704 to expose the first part 70a.

Figure 9D:
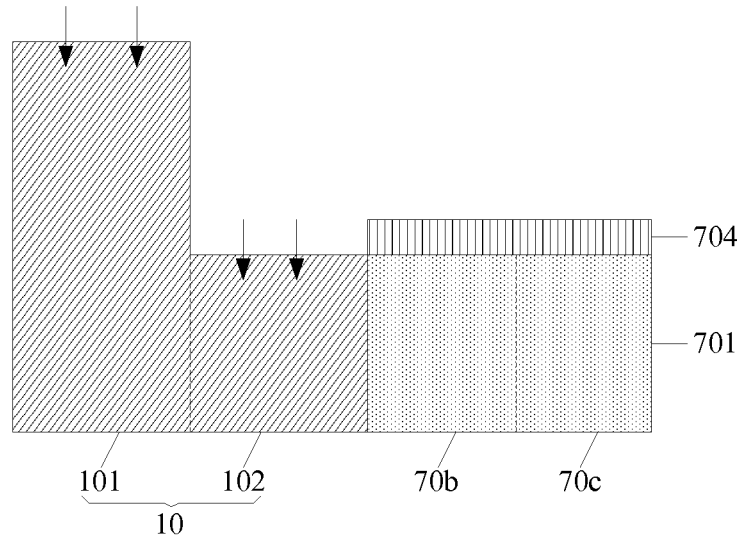

S104. As shown in FIG. 9(d), perform heavy doping of P-type ions on the exposed area by means of ion implantation, and perform rapid annealing treatment, so as to form a source 10.

The P-type ions may include at least one of boron ions, gallium ions, or indium ions, and an ion concentration range for the heavy doping may be e$^{19}$-e$^{21}$ cm$^{-3}$.

Herein, the source 10 includes the first area 101 and the second area 102 that are perpendicular in an "L" shape.

Figure 9E:
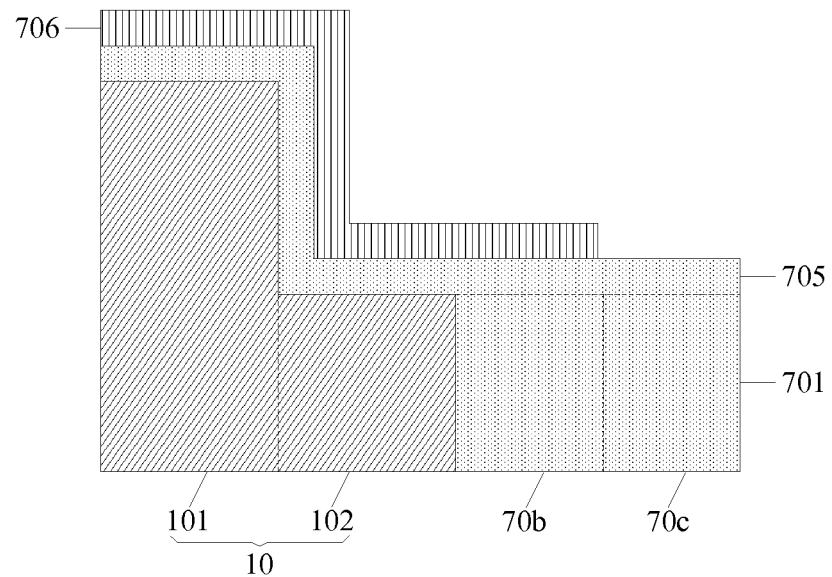

S105. As shown in FIG. 9(e), remove the remaining second hard mask layer 704, then epitaxially form a silicon epitaxial layer 705 with a thickness of about 5 nm, and deposit a third hard mask layer 706 on the silicon epitaxial layer 705, and perform patterning processing on the third hard mask layer 706 to expose the third part 70c and the epitaxial layer 705 located directly over the third part 70c.

Figure 9F:
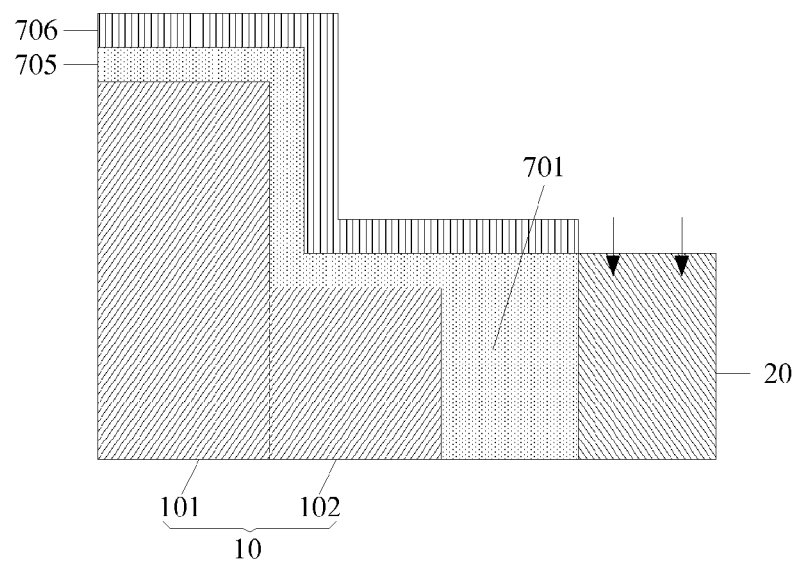

S106. As shown in FIG. 9(f), perform heavy doping of N-type ions on the exposed area by means of ion implantation, and perform rapid annealing treatment, so as to form a drain 20.

The N-type ions may include at least one of phosphorus ions or arsenic ions, and an ion concentration range for the heavy doping may be e$^{19}$-e$^{21}$ cm$^{-3}$.

Figure 9G:
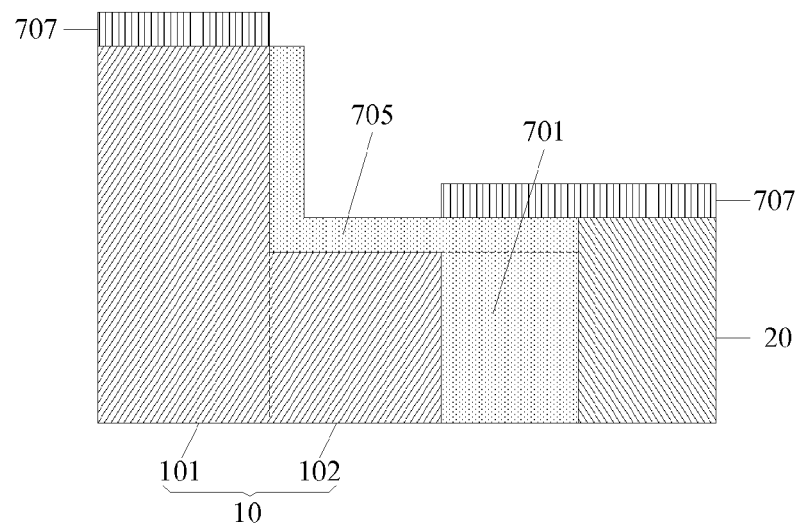

S107. As shown in FIG. 9(g), remove the remaining third hard mask layer 706 and the silicon epitaxial layer 705 located on the first area 101, deposit a fourth hard mask layer 707 on the exposed first area 101, silicon epitaxial layer 705, and drain 20, and perform patterning processing on the fourth hard mask layer 707 to expose the silicon epitaxial layer 705 located directly over the second area 102.

Figure 9H:
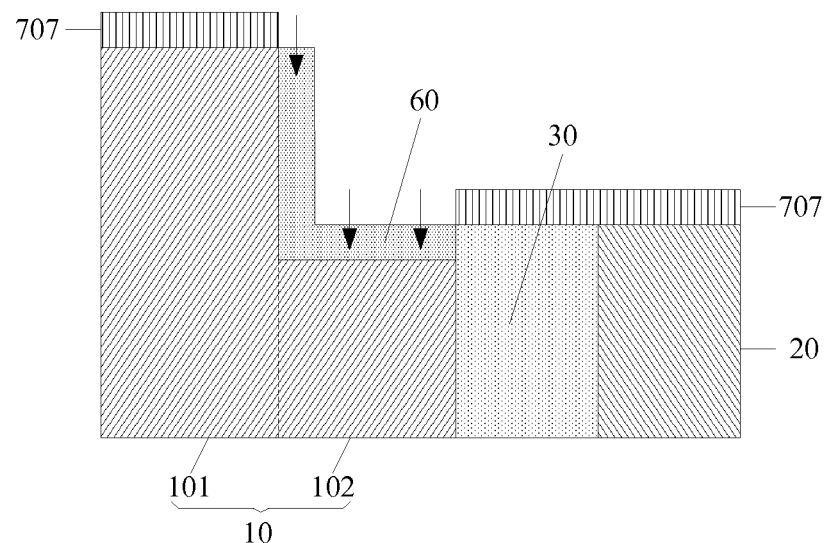
Figure 9I:
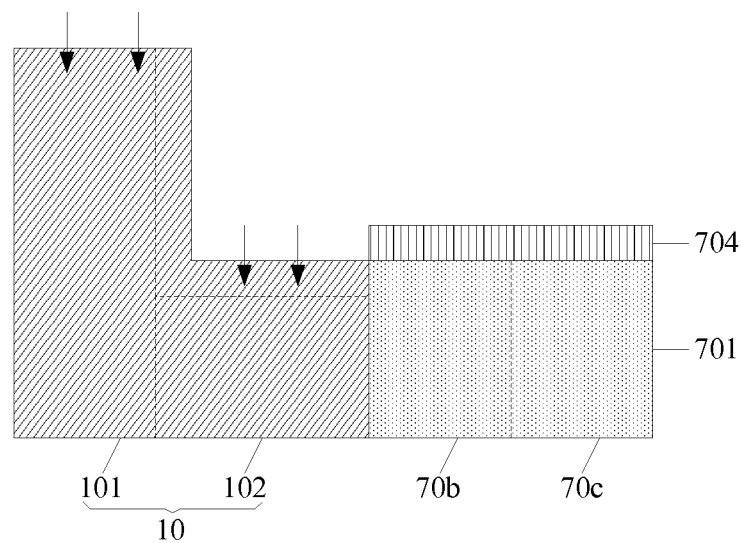
Figure 9J:
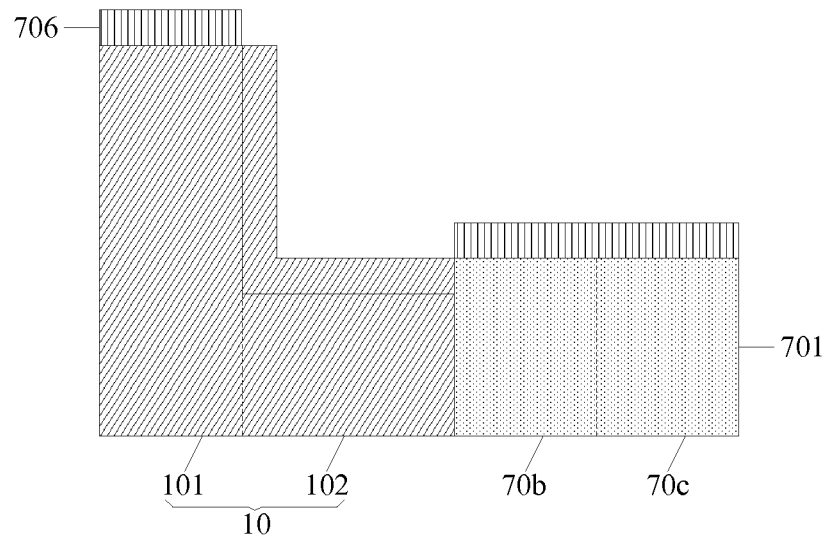
Figure 9K:
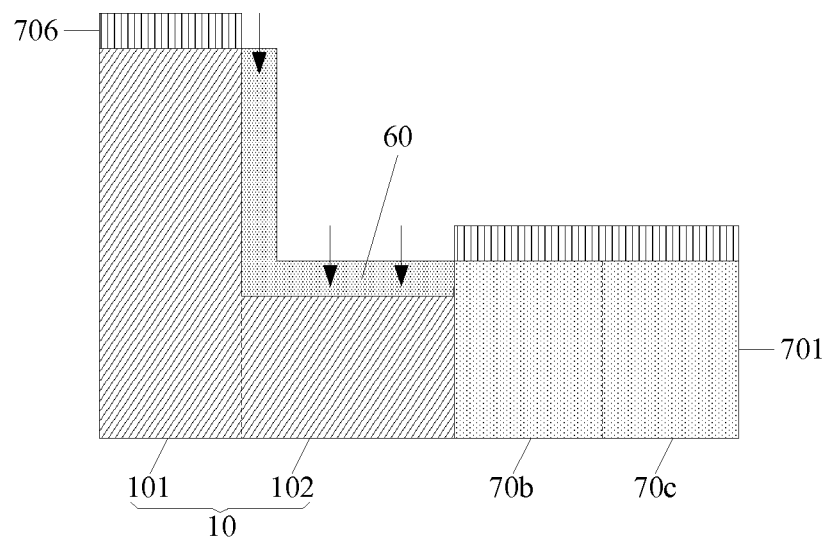
Figure 9L:
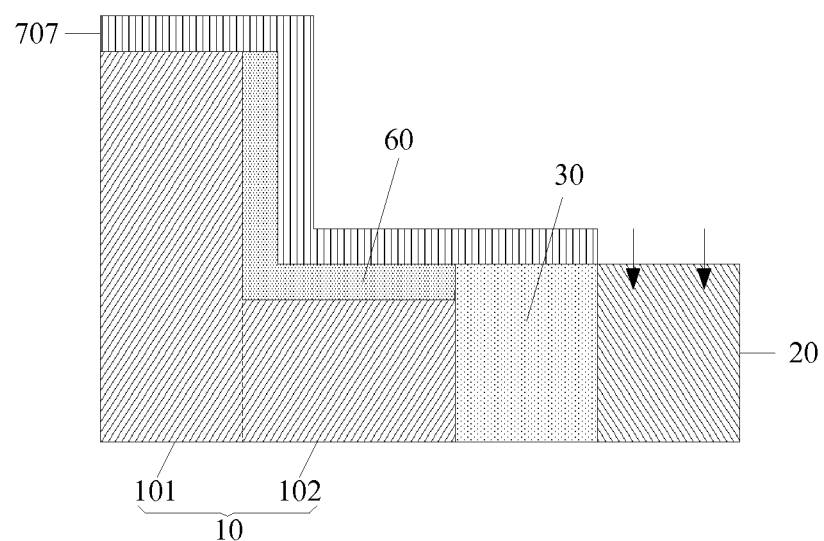

S108. As shown in FIG. 9(h), perform heavy doping or light doping of N-type ions, or skip performing doping on the exposed area, so as to form a tunneling region 60, in this case, the silicon epitaxial layer 705 and the second part 70b that are located between the source 10 and the drain 20 together form an active region 30, and then remove the remaining fourth hard mask layer 707.

An ion concentration range for the heavy doping may be e$^{19}$-e$^{21}$ cm$^{-3}$, an ion concentration range for the light doping concentration may be e$^{17}$-e$^{18}$ cm$^{-3}$, and an ion concentration for the undoping is the same as a concentration of a substrate.

S109. Referring to FIG. 3 to FIG. 5, prepare a gate dielectric layer 40 and a gate 50, and complete a subsequent process, such as metal contact, so as to form a complete tunneling field effect transistor.

A material of the gate dielectric layer 40 may be one of insulated materials, such as silicon oxide, silicon nitride, silicon oxynitride, and aluminum oxide, and a material of the gate 50 may be one of metal, metal silicide, and polycrystalline silicon.

Herein, the gate insulation layer 40 is in an "L" shape, and the gate insulation layer 40 may be in contact with the tunneling region 60, and may also be in contact with both the active region 30 and the drain 20.

It should be noted herein that, when the gate 50 is formed, a sacrificial layer and a hard mask layer may be formed on, for example, a metal layer, for forming the gate 50, thereby ensuring that the metal layer may not be affected by an etching solution when the hard mask layer is etched, and ensuring planarization of a surface of the metal layer.

The tunneling field effect transistor as shown in FIG. 3 to FIG. 5 can be prepared by using the foregoing steps S101-S109, and the foregoing preparation method has good compatibility with an existing preparation process of a tunneling field effect transistor, and process steps are simple.

Alternatively, optionally, referring to FIG. 3 to FIG. 5, the source 10 includes the first area 101 and the second area 102, and the second area 102 is in contact with the active region 30.

Further, forming the active region 30, the source 10, the drain 20, and the tunneling region 60 on the substrate 70 may include etching the substrate 70 to form an "L"-shaped substrate, where the "L"-shaped substrate includes three parts, and the second part 70b is located between the first part 70a and the third part 70c, and the first part 70a corresponds to the source to be formed 10, the second part 70b corresponds to the active region to be formed 30, and the third part 70c corresponds to the drain to be formed 20, performing ion implantation on the first part 70a to form the source 10 and an ion implantation region, where the source 10 includes the first area 101 and the second area 102 that are perpendicularly connected in an "L" shape, and the second area 102 is in contact with the second part 70b, and the ion implantation region is in an "L" shape and is located on an inner side of the "L"-shaped source 10, performing ion implantation on the ion implantation region to form the tunneling region 60, after forming the tunneling region 60, performing ion implantation on the third part 70c to form the drain 20, and forming the active region 30 with the second part 70b.

Figure 10:
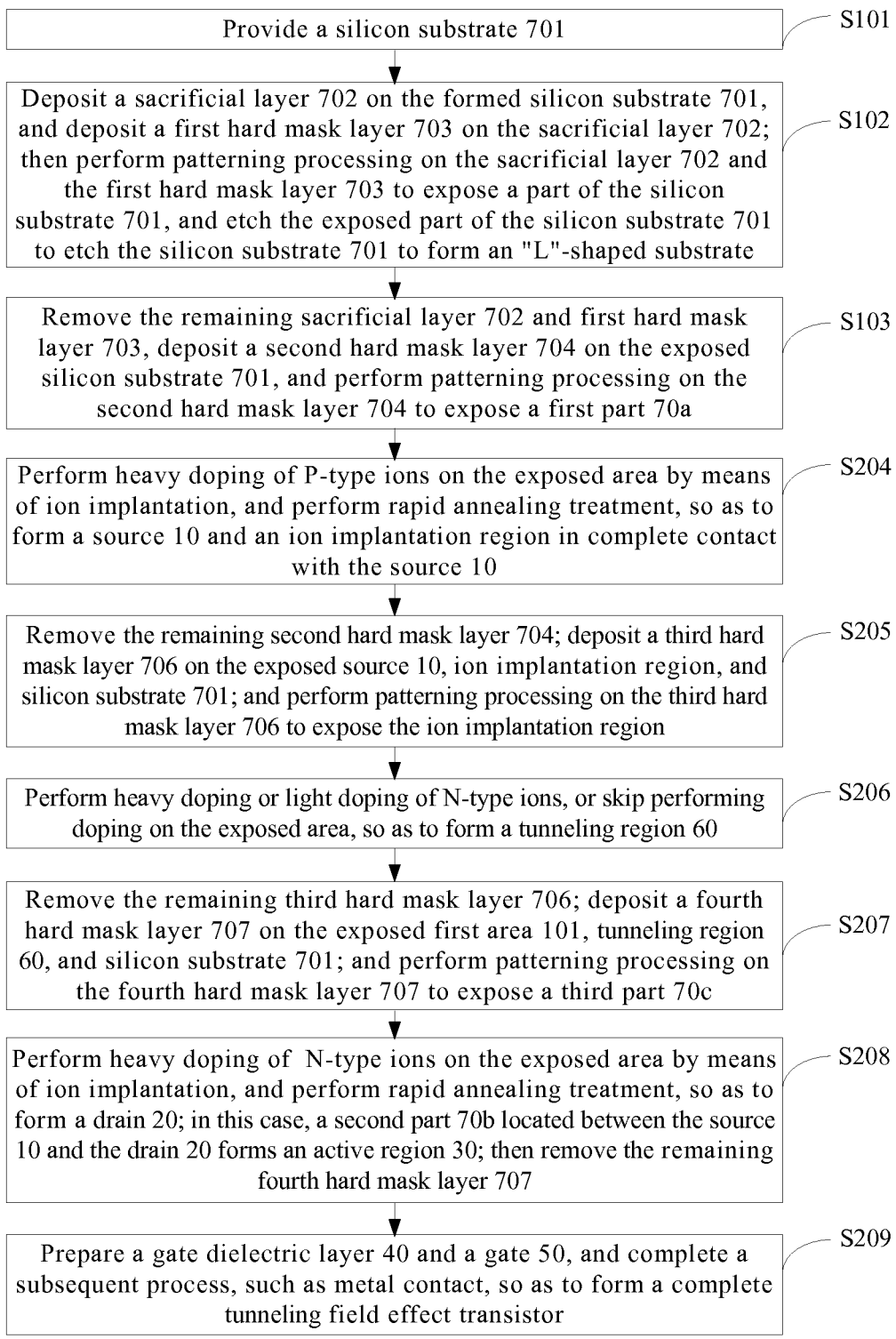
FIG. 10 is a flowchart 2 of preparing a tunneling field effect transistor according to an embodiment of the present invention.

Based on the foregoing steps S101-S103, a specific Embodiment 2 is further provided for describing the preparation process of the tunneling field effect transistor as shown in FIG. 3 to FIG. 5. As shown in FIG. 10, preparation of the tunneling field effect transistor may include the following steps.

S204. As shown in FIG. 9(*i*), perform heavy doping of P-type ions on the exposed area by means of ion implantation, and perform rapid annealing treatment, so as to form a source 10 and an ion implantation region in complete contact with the source 10.

The P-type ions may include at least one of boron ions, gallium ions, or indium ions, and an ion concentration range for the heavy doping may be $e^{19}$-$e^{21}$ cm$^{-3}$.

Herein, the source 10 includes the first area 101 and the second area 102 that are perpendicular in an "L" shape, and the ion implantation region is in an "L" shape and is located on an inner side of the "L"-shaped source 10.

S205. As shown in FIG. 9(*j*), remove the remaining second hard mask layer 704, deposit a third hard mask layer 706 on the exposed source 10, ion implantation region, and silicon substrate 701, and perform patterning processing on the third hard mask layer 706 to expose the ion implantation region.

The ion implantation region corresponds to the tunneling region to be formed 60.

S206. As shown in FIG. 9(*k*), perform heavy doping or light doping of N-type ions on the exposed area, so as to form the tunneling region 60.

An ion concentration range for the heavy doping is $e^{19}$-$e^{21}$ cm$^{-3}$, and an ion concentration range for the light doping concentration is $e^{17}$-$e^{18}$ cm$^{-3}$.

S207. As shown in FIG. 9(*l*), remove the remaining third hard mask layer 706, deposit a fourth hard mask layer 707 on the exposed first area 101, tunneling region 60, and silicon substrate 701, and perform patterning processing on the fourth hard mask layer 707 to expose a third part 70c.

S208. Referring to FIG. 9(*l*), perform heavy doping of N-type ions on an exposed area by means of ion implantation, and perform rapid annealing treatment, so as to form a drain 20, in this case, the second part 70b located between the source 10 and the drain 20 forms the active region 30, then remove the remaining fourth hard mask layer 707.

The N-type ions may include at least one of phosphorus ions or arsenic ions, and an ion concentration range for the heavy doping may be $e^{19}$-$e^{21}$ cm$^{-3}$.

S209. Referring to FIG. 3 to FIG. 5, prepare a gate dielectric layer 40 and a gate 50, and complete a subsequent process, such as metal contact, so as to form a complete tunneling field effect transistor.

A material of the gate dielectric layer 40 may be one of insulated materials, such as silicon oxide, silicon nitride, silicon oxynitride, and aluminum oxide, and a material of the gate 50 may be one of metal, metal silicide, and polycrystalline silicon.

Herein, the gate insulation layer 40 is in an "L" shape, and the gate insulation layer 40 may be in contact with the tunneling region 60, and may also be in contact with both the active region 30 and the drain 20.

It should be noted herein that, when the gate 50 is formed, a sacrificial layer and a hard mask layer may be formed on, for example, a metal layer, for forming the gate 50, thereby ensuring that the metal layer may not be affected by an etching solution when the hard mask layer is etched, and ensuring planarization of a surface of the metal layer.

The tunneling field effect transistor as shown in FIG. 3 to FIG. 5 can be prepared by using the foregoing steps S101-S103 and S204-S209, and the foregoing preparation method has good compatibility with an existing preparation process of a tunneling field effect transistor, and process steps are simple.

Figure 6:
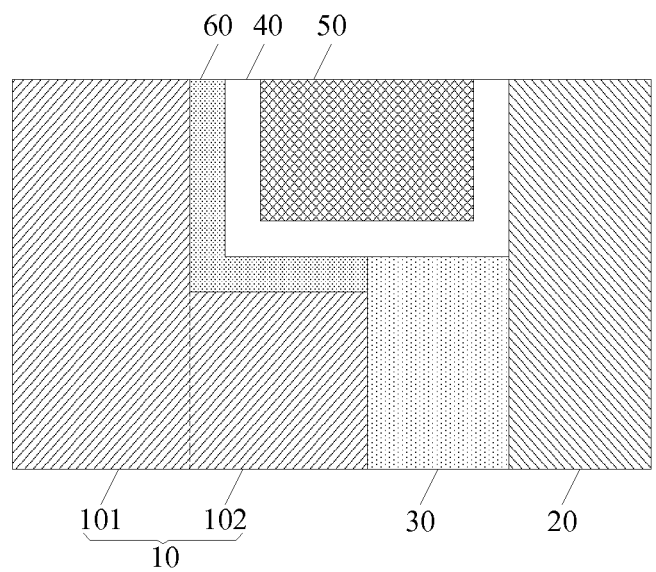
FIG. 6 is a schematic structural diagram 4 of a tunneling field effect transistor according to an embodiment of the present invention.

Alternatively, optionally, referring to FIG. 6, the source 10 includes the first area 101 and the second area 102, and the second area 102 is in contact with the active region 30.

Further, forming the active region 30, the source 10, the drain 20, and the tunneling region 60 on the substrate 70 includes performing ion implantation on the substrate 70 corresponding to the drain to be formed 20 to form the drain 20, after forming the drain 20, etching other parts of the substrate 70 except the drain 20 to form an "L"-shaped substrate, where the "L"-shaped substrate includes two parts, and the second part 70b is located between the first part 70a and the drain 20, and the first part 70a corresponds to the source to be formed 10, and the second part 70b corresponds to the active region to be formed 30, performing ion implantation on the first part 70a to form the source 10, where the source 10 includes the first area 101 and the second area 102 that are perpendicularly connected in an "L" shape, and the second area 102 is in contact with the second part 70b, after forming the source 10, forming an epitaxial layer 705 on the substrate, and etching to remove the epitaxial layer 705 on the first area 101 and the drain 20, performing ion implantation or skipping performing ion implantation on the epitaxial layer 705 directly over the second area 102 to form the tunneling region 60, and forming the active region 30 with the second part 70b and the epitaxial layer 705 located directly over the second part 70b.

Figure 11A:
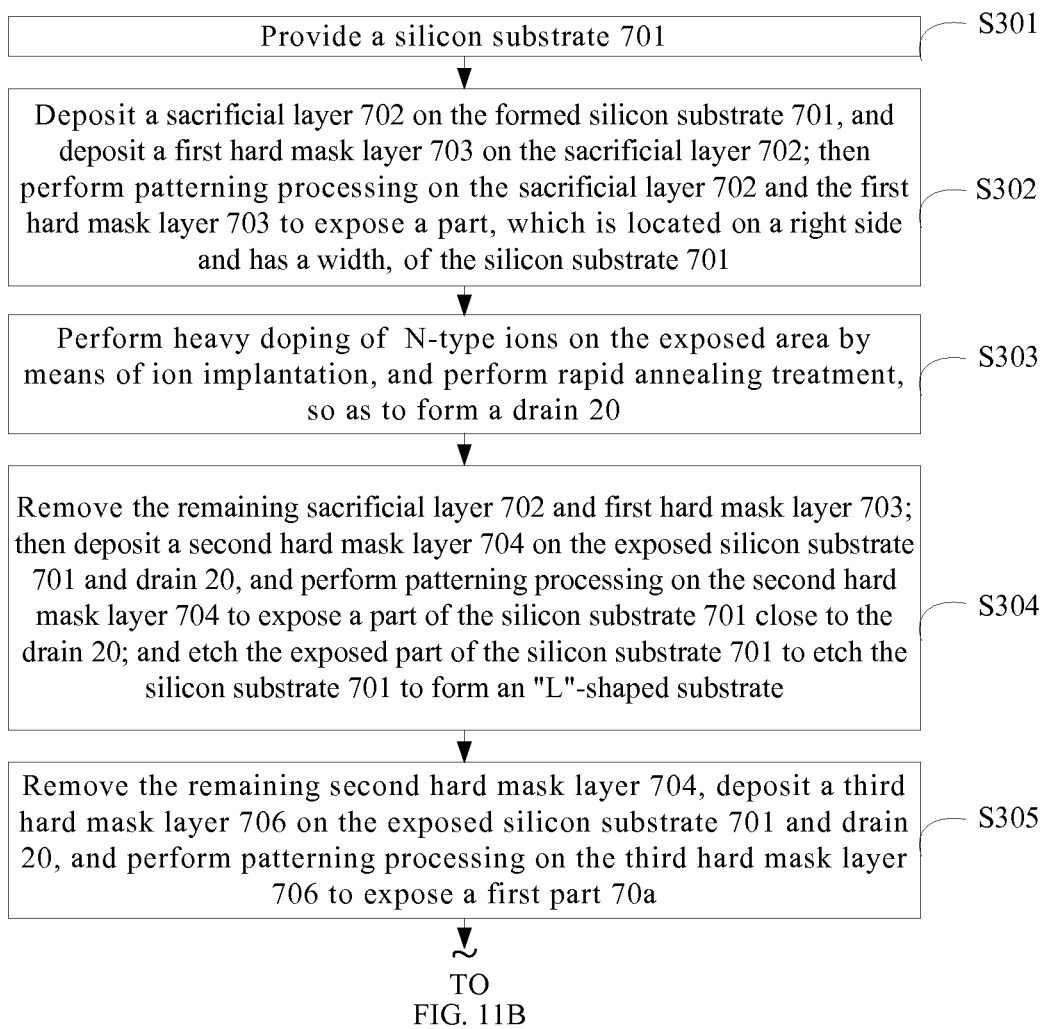

The following provides a specific Embodiment 3 for describing a preparation process of the tunneling field effect transistor as shown in FIG. 6. As shown in FIG. 11A and FIG. 11B, preparation of the tunneling field effect transistor may include the following steps.

S301. Referring to FIG. 9(a), provide a silicon substrate 701.

The silicon substrate 701 may be a rectangular substrate.

The silicon substrate 701 may perform light doping herein, and a P-well substrate, an N-well substrate, or a twin-well substrate may be formed by means of doping.

Figure 12A:
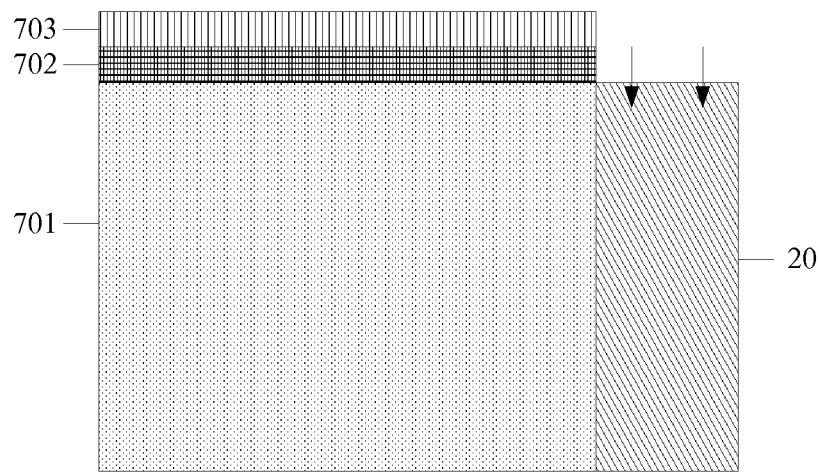
FIG. 12(a) to FIG. 12(e) are a schematic diagram 3 of a preparation process of a tunneling field effect transistor according to an embodiment of the present invention.

S302. As shown in FIG. 12(a), deposit a sacrificial layer 702 on the formed silicon substrate 701, and deposit a first hard mask layer 703 on the sacrificial layer 702, then perform patterning processing on the sacrificial layer 702 and the first hard mask layer 703 to expose a part, which is located on a right side and has a width, of the silicon substrate 701.

The exposed part of the silicon substrate 701 corresponds to a drain to be formed 20.

Herein, the sacrificial layer 702 and the hard mask layer may be implemented by using a process, such as LPCVD or PVD. The hard mask layer may use a silicon oxide material, a silicon nitride material, a silicon oxynitride material, or the like. The sacrificial layer 702 can be regarded as a protective layer, when the hard mask layer is etched, the sacrificial layer 702 may prevent the silicon substrate 701 from being affected by an etching solution and planarize a surface of the silicon substrate 701.

S303. Referring to FIG. 12(a), perform heavy doping of N-type ions on the exposed area by means of ion implantation, and perform rapid annealing treatment, so as to form a drain 20.

The N-type ions may include at least one of phosphorus ions or arsenic ions, and an ion concentration range for the heavy doping may be $e^{19}$-$e^{21}$ cm$^{-3}$.

Figure 12B:
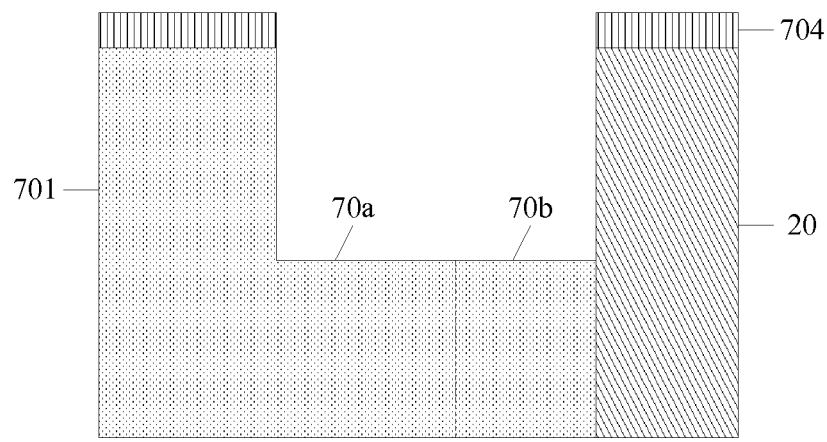

S304. As shown in FIG. 12(b), remove the remaining sacrificial layer 702 and first hard mask layer 703, then deposit a second hard mask layer 704 on the exposed silicon substrate 701 and drain 20, and perform patterning processing on the second hard mask layer 704 to expose a part of the silicon substrate 701 close to the drain 20, and etch the exposed part of the silicon substrate 701 to etch the silicon substrate 701 to form an "L"-shaped substrate.

The "L"-shaped substrate includes two parts, and the second part 70b is located between the first part 70a and the drain 20, and the first part 70a corresponds to a source to be formed 10, and the second part 70b corresponds to the active region to be formed 30.

Figure 12C:
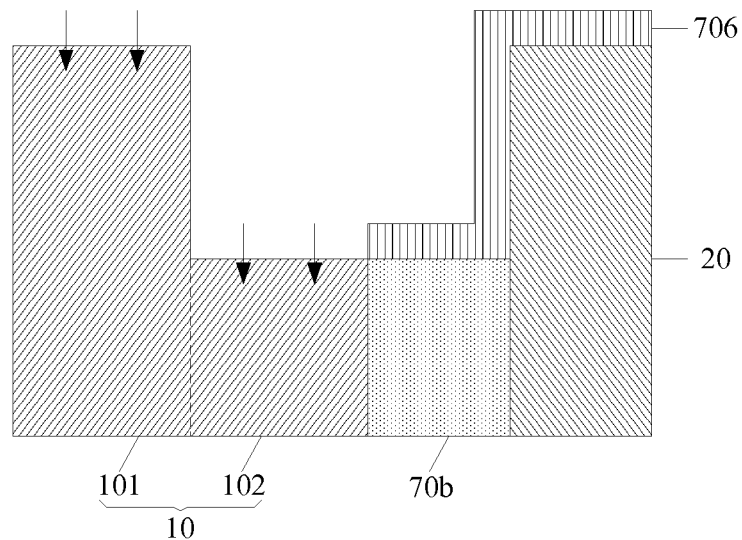

S305. As shown in FIG. 12(c), remove the remaining second hard mask layer 704, deposit a third hard mask layer 706 on the exposed silicon substrate 701 and drain 20, and perform patterning processing on the third hard mask layer 706 to expose a first part 70a.

S306. Referring to FIG. 12(c), perform heavy doping of P-type ions on the exposed area by means of ion implantation, and perform rapid annealing treatment, so as to form a source 10.

Herein, the source 10 includes the first area 101 and the second area 102 that are perpendicular in an "L" shape.

The P-type ions may include at least one of boron ions, gallium ions, or indium ions, and an ion concentration range for the heavy doping may be $e^{19}$-$e^{21}$ cm$^{-3}$.

Figure 12D:
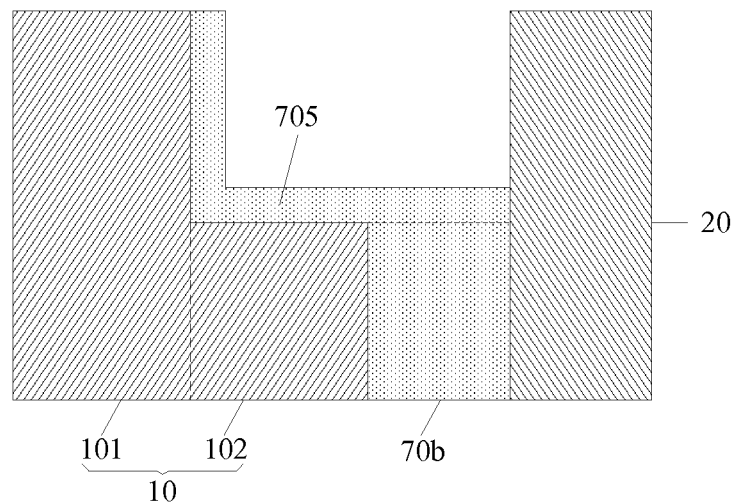

S307. As shown in FIG. 12(d), remove the remaining third hard mask layer 706, then epitaxially form a silicon epitaxial layer 705 with a thickness of about 5 nm, and etch to remove the silicon epitaxial layer 705 on the first area 101 and the drain 20.

Figure 12E:
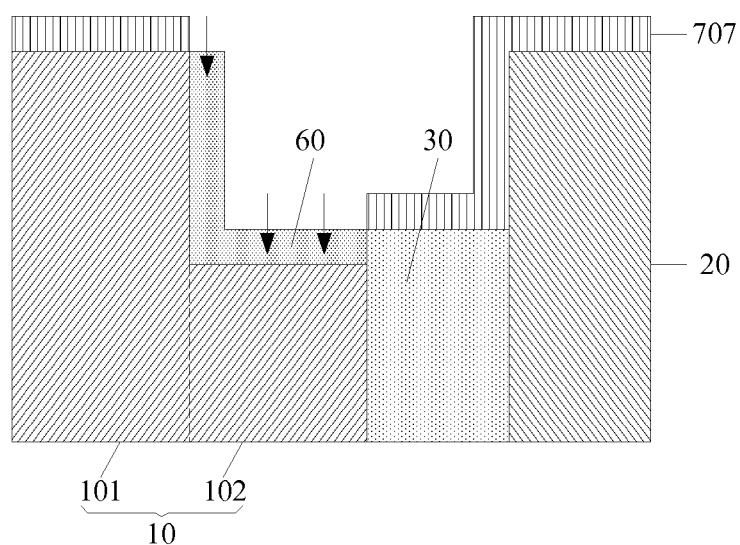

S308. As shown in FIG. 12(e), deposit a fourth hard mask layer 707 on the first area 101, the silicon epitaxial layer 705, and the drain 20, and perform patterning processing on the fourth hard mask layer 707 to expose the silicon epitaxial layer 705 that is located on the second area 102 and in an "L"-shape.

S309. Referring to FIG. 12(e), perform heavy doping or light doping of N-type ions, or skip performing doping on the exposed area, so as to form a tunneling region 60, in this case, the second part 70b and the silicon epitaxial layer 705 that are located between the source 10 and the drain 20 together form the active region 30, and then remove the remaining fourth hard mask layer 707.

An ion concentration range for the heavy doping may be $e^{19}$-$e^{21}$ cm$^{-3}$, an ion concentration range for the light doping concentration may be $e^{17}$-$e^{18}$ cm$^{-3}$, and an ion concentration for the undoping is the same as a concentration of a substrate.

S310. Referring to FIG. 6, prepare a gate dielectric layer 40 and a gate 50, and complete a subsequent process, such as metal contact, so as to form a complete tunneling field effect transistor.

A material of the gate dielectric layer 40 may be one of insulated materials, such as silicon oxide, silicon nitride, silicon oxynitride, and aluminum oxide, and a material of the gate 50 may be one of metal, metal silicide, and polycrystalline silicon.

Herein, the gate insulation layer 40 is in a "U" shape, and the gate insulation layer 40 is in contact with the tunneling region 60, the active region 30, and the drain 20.

It should be noted herein that, when the gate 50 is formed, a sacrificial layer and a hard mask layer may be formed on, for example, a metal layer, for forming the gate 50, thereby ensuring that the metal layer may not be affected by an etching solution when the hard mask layer is etched, and ensuring planarization of a surface of the metal layer.

The tunneling field effect transistor as shown in FIG. 6 can be prepared by using the foregoing steps S301-S310, and the foregoing preparation method has good compatibility with an existing preparation process of a tunneling field effect transistor, and process steps are simple.

Optionally, referring to FIG. 7, the source 10 includes the first area 101, the second area 102, and a third area 103, and the third area 103 is in contact with the active region 30.

Further, forming the active region 30, the source 10, the drain 20, and the tunneling region 60 on the substrate 70 may include etching the substrate 70 to form a "U"-shaped substrate, where the "U"-shaped substrate includes three parts, and the second part 70b is located between the first part 70a and the third part 70c, and the first part 70a corresponds to the source to be formed 10, the second part 70b corresponds to the active region to be formed 30, and the third part 70c corresponds to the drain to be formed 20, performing ion implantation on the first part 70a to form the source 10, where the source 10 includes the first area 101, the second area 102, and the third area 103, and the third area 103 is in contact with the second part 70b, and both the first area 101 and the second area 102, and the second area 102 and the third area 103 are perpendicularly connected in an "L" shape, after forming the source 10, forming an epitaxial layer 705 on the "U"-shaped substrate, performing ion implantation or skipping performing ion implantation on the epitaxial layer 705 that is located directly over the second area 102 and is aligned with the source 10 to form the tunneling region 60, after forming the tunneling region 60, etching to remove the epitaxial layer 705 on the first area 101 of the source 10, and performing ion implantation on the third part 70c and the epitaxial layer 705 in contact with the third part 70c to form the drain 20, and forming the active region 30 with the second part 70b and the epitaxial layer 705 corresponding to the second part 70b.

Figure 13:
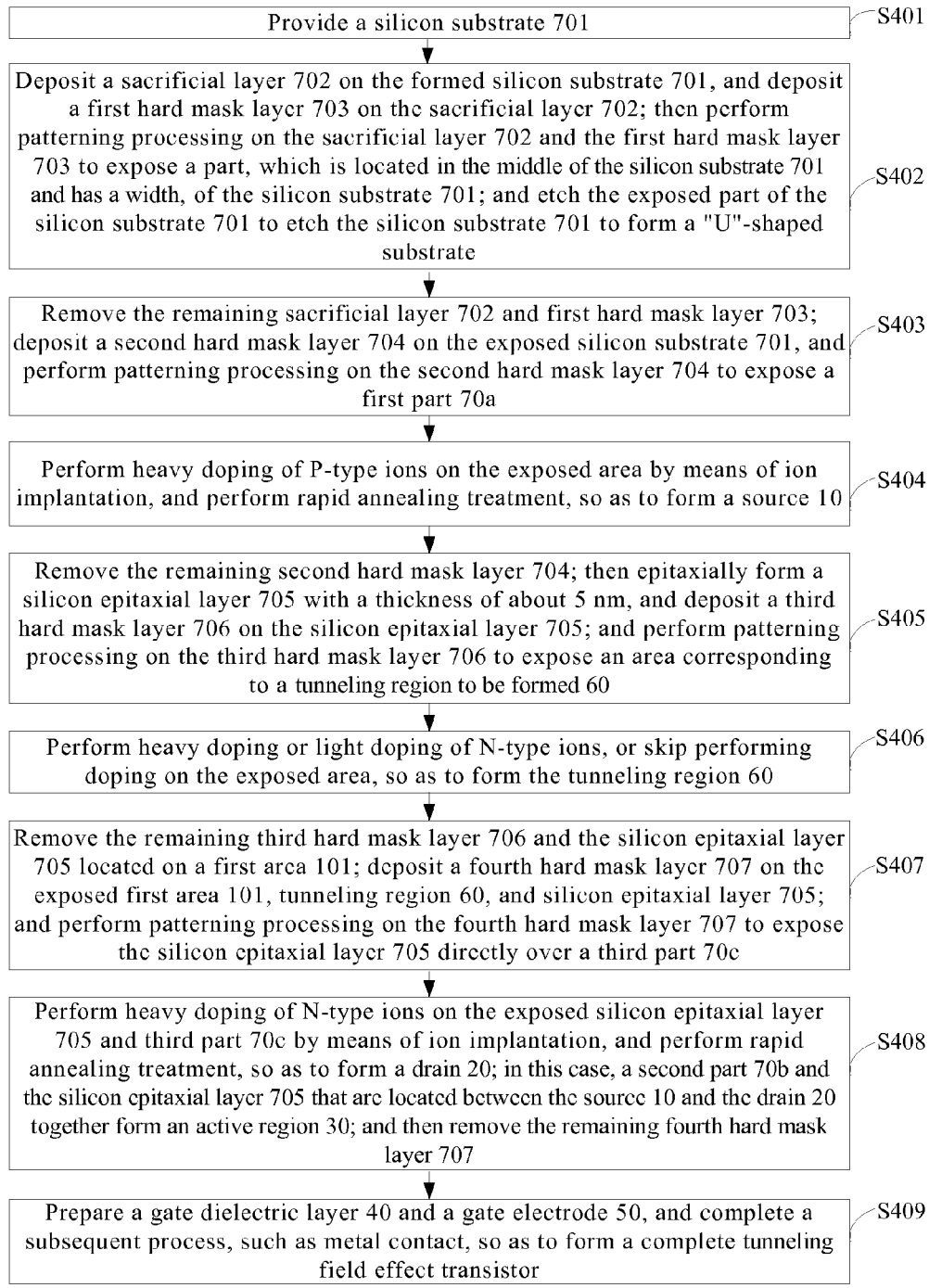
FIG. 13 is a flowchart 4 of preparing a tunneling field effect transistor according to an embodiment of the present invention.

The following provides a specific Embodiment 4 for describing a preparation process of the tunneling field effect transistor as shown in FIG. 7. As shown in FIG. 13, preparation of the tunneling field effect transistor may include the following steps.

S401. Referring FIG. 9(a), provide a silicon substrate 701. The silicon substrate 701 may be a rectangular substrate.

The silicon substrate 701 may perform light doping herein, and a P-well substrate, an N-well substrate, or a twin-well substrate may be formed by means of doping.

Figure 14A:
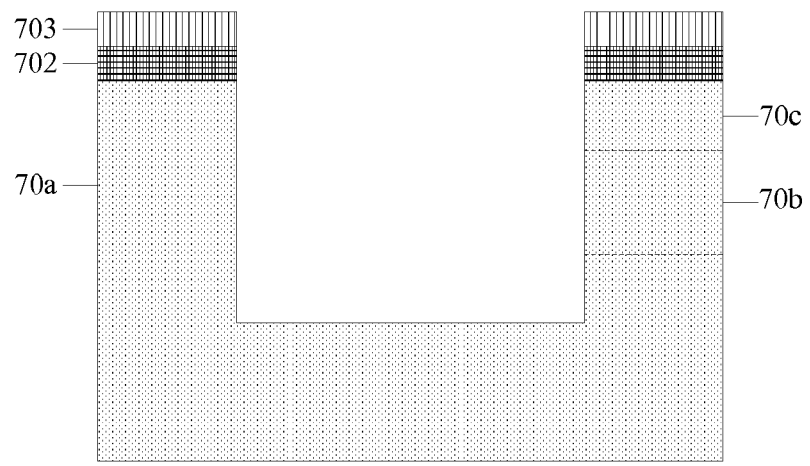
FIG. 14(a) to FIG. 14(f) are a schematic diagram 4 of a preparation process of a tunneling field effect transistor according to an embodiment of the present invention.

S402. As shown in FIG. 14(a), deposit a sacrificial layer 702 on the formed silicon substrate 701, and deposit a first hard mask layer 703 on the sacrificial layer 702, then perform patterning processing on the sacrificial layer 702 and the first hard mask layer 703 to expose a part, which is located in the middle of the silicon substrate 701 and has a width, of the silicon substrate 701, and etch the exposed part of the silicon substrate 701 to etch the silicon substrate 701 to form a "U"-shaped substrate.

The "U"-shaped substrate includes three parts, and the second part 70b is located between the first part 70a and the third part 70c, and the first part 70a corresponds to a source to be formed 10, the second part 70b corresponds to an active region to be formed 30, and the third part 70c corresponds to a drain to be formed 20.

Herein, the sacrificial layer 702 and the hard mask layer may be implemented by using a process, such as LPCVD or PVD. The hard mask layer may use a silicon oxide material, a silicon nitride material, a silicon oxynitride material, or the like. The sacrificial layer 702 can be regarded as a protective layer, when the hard mask layer is etched, the sacrificial layer 702 may prevent the silicon substrate 701 from being affected by an etching solution and planarize a surface of the silicon substrate 701.

Figure 14B:
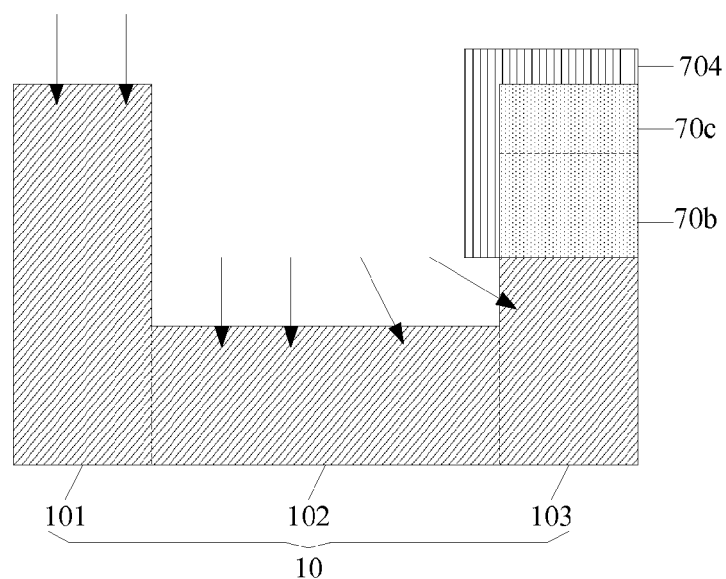

S403. As shown in FIG. 14(b), remove the remaining sacrificial layer 702 and first hard mask layer 703, deposit a second hard mask layer 704 on the exposed silicon substrate 701, and perform patterning processing on the second hard mask layer 704 to expose the first part 70a.

S404. Referring to FIG. 14(b), perform heavy doping of P-type ions on the exposed area by means of ion implantation, and perform rapid annealing treatment, so as to form a source 10.

Herein, the source 10 includes a first area 101, a second area 102, and a third area 103, and both the first area 101 and the second area 102, and the second area 102 and the third area 103 are perpendicularly connected in an "L" shape.

The P-type ions may include at least one of boron ions, gallium ions, or indium ions, and an ion concentration range for the heavy doping may be $e^{19}$-$e^{21}$ cm$^{-3}$.

Figure 14C:
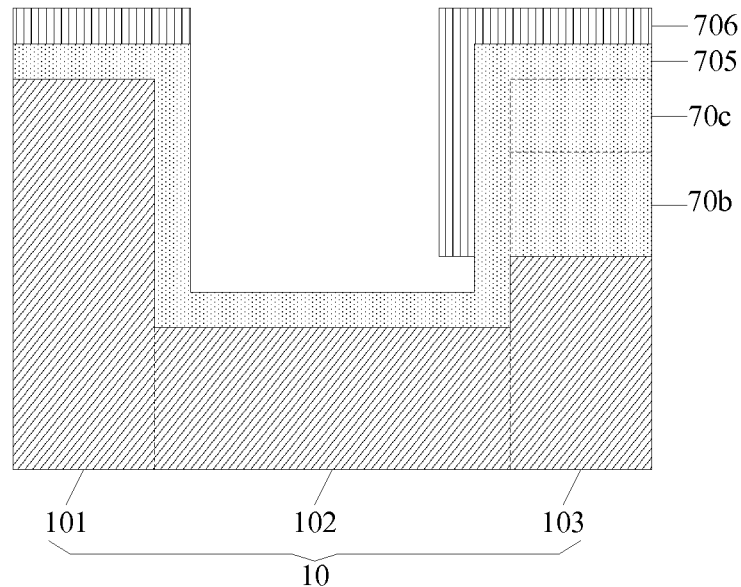

S405. As shown in FIG. 14(c), remove the remaining second hard mask layer 704, then epitaxially form a silicon epitaxial layer 705 with a thickness of about 5 nm, and deposit a third hard mask layer 706 on the silicon epitaxial layer 705, and perform patterning processing on the third hard mask layer 706 to expose an area corresponding to a tunneling region to be formed 60.

Figure 14D:
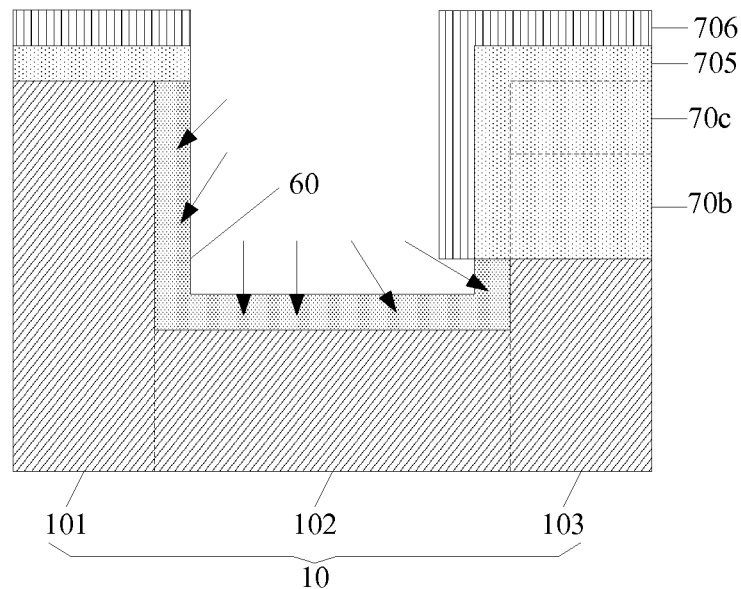

S406. As shown in FIG. 14(d), perform heavy doping or light doping of N-type ions, or skip performing doping on the exposed area, so as to form the tunneling region 60.

Herein, both ends of the tunneling region 60 are aligned with both ends of the source 10.

An ion concentration range for the heavy doping may be $e^{19}$-$e^{21}$ cm$^{-3}$, an ion concentration range for the light doping concentration may be $e^{17}$-$e^{18}$ cm$^{-3}$, and an ion concentration for the undoping is the same as a concentration of a substrate.

Figure 14E:
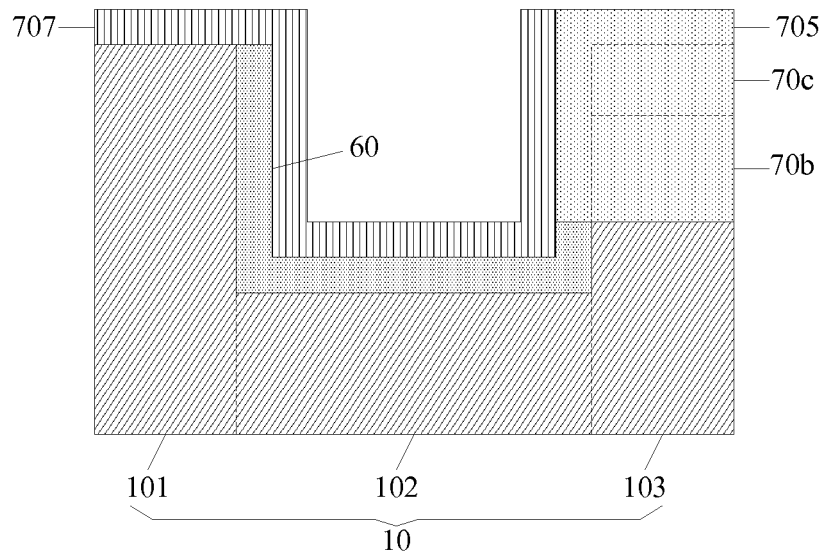
Figure 14F:
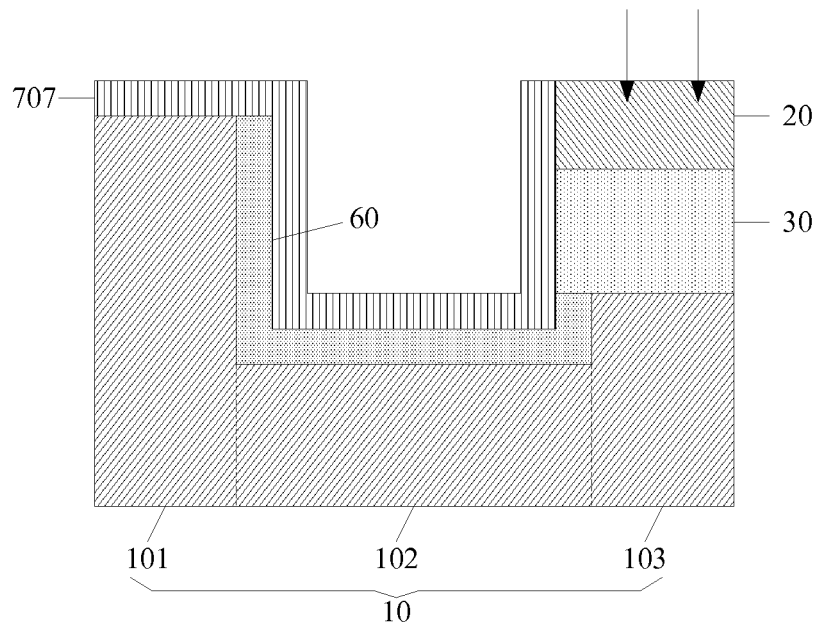

S407. As shown in FIG. 14(e), remove the remaining third hard mask layer 706 and the silicon epitaxial layer 705 located on the first area 101, deposit a fourth hard mask layer 707 on the exposed first area 101, tunneling region 60, and silicon epitaxial layer 705, and perform patterning processing on the fourth hard mask layer 707 to expose the silicon epitaxial layer 705 on the third part 70c.

S408. As shown in 14(f), perform heavy doping of N-type ions on the exposed silicon epitaxial layer 705 and third part 70c by means of ion implantation, and perform rapid annealing treatment, so as to form a drain 20, in this case, the second part 70b and the silicon epitaxial layer 705 that are located between the source 10 and the drain 20 together form the active region 30, and then remove the remaining fourth hard mask layer 707.

The N-type ions may include at least one of phosphorus ions or arsenic ions, and an ion concentration range for the heavy doping may be $e^{19}$-$e^{21}$ cm$^{-3}$.

S409. Referring to FIG. 7, prepare a gate dielectric layer 40 and a gate 50, and complete a subsequent process, such as metal contact, so as to form a complete tunneling field effect transistor.

A material of the gate dielectric layer 40 may be one of insulated materials, such as silicon oxide, silicon nitride, silicon oxynitride, and aluminum oxide, and a material of the gate 50 may be one of metal, metal silicide, and polycrystalline silicon.

Herein, the gate insulation layer 40 is in a "U" shape, and the gate insulation layer 40 is in contact with the tunneling region 60, the active region 30, and the drain 20.

It should be noted herein that, when the gate 50 is formed, a sacrificial layer and a hard mask layer may be formed on, for example, a metal layer, for forming the gate 50, thereby ensuring that the metal layer may not be affected by an etching solution when the hard mask layer is etched, and ensuring planarization of a surface of the metal layer.

The tunneling field effect transistor as shown in FIG. 7 can be prepared by using the foregoing steps S401-S409, and the foregoing preparation method has good compatibility with an existing preparation process of a tunneling field effect transistor, and process steps are simple.

It should be noted that, in the foregoing specific embodiments, the preparation method of the tunneling field effect transistor is exemplarily described, and the preparation method of the tunneling field effect transistor may also be another step order.

In the embodiments of the present invention, a structure of the gate 50 is not specifically limited. Persons skilled in the art should understand that, the gate 50 may be of a single gate structure, a multi-gate structure, and a gate-around structure, all the foregoing gate structures can achieve objects of the present invention, and details are not repeatedly described herein.

In addition, all the preparation methods of the tunneling field effect transistor provided in the embodiments of the present invention use a gate-last process, but this structure may also be prepared by using a gate-first process. The gate-last process refers to that after ion implantation and annealing treatment are performed on the silicon substrate to form the source 10 and the drain 20, the gate 50 is formed. The gate-first process refers to that the gate 50 is formed before ion implantation and annealing treatment are performed on the silicon substrate to form the source 10 and the drain 20.

The foregoing descriptions are specific implementation manners of the present invention, but are not intended to limit the protection scope of the present invention. Any variation or replacement readily figured out by persons skilled in the art within the technical scope disclosed in the present invention shall fall within the protection scope of the present invention. Therefore, the protection scope of the present invention shall be subject to the protection scope of the claims.

What is claimed is:

1. A tunneling field effect transistor, comprising:
    an active region between a source and a drain, a gate dielectric layer, and a gate located on a side of the gate dielectric layer deviating from the source; and
    a tunneling region disposed between the gate dielectric layer and the source and in contact with both the gate dielectric layer and the source,
    wherein the source comprises at least a first area and a second area perpendicularly connected in an "L" shape,
    wherein the tunneling region is in contact at east the first area and the second area, and
    wherein the gate dielectric layer is in contact with at least the tunneling region.

2. The tunneling field effect transistor according to claim 1, wherein both ends of the tunneling region are aligned with both ends of the source.

3. The tunneling field effect transistor according to claim 2, wherein the source comprises the first area and the second area, wherein the second area is in contact with the active region, and wherein, along a direction perpendicular to a direction from the source towards the drain, a thickness of the active region is equal to a sum of a thickness of the second area and a thickness of the tunneling region in contact with the second area.

4. The tunneling field effect transistor according to claim 3, wherein a thickness of the drain is greater than or equal to the thickness of the active region.

5. The tunneling field effect transistor according to claim wherein the source further comprises a third area perpendicularly connected to the second area in an "L" shape and disposed on a same side as the first area, and wherein the active region is located between the drain and the third area, and the gate dielectric layer is further in contact with the active region and the drain.

6. The tunneling field effect transistor according to claim 5, wherein along a direction perpendicular to a direction from the source towards the drain, a thickness of the active region is equal to a sum of a thickness of the third area and a thickness of the tunneling region in contact with the third area.

7. The tunneling field effect transistor according to claim 1, wherein a thickness of the tunneling region is less than 10 nanometers (nm).

8. The tunneling field effect transistor according to claim 1, wherein the tunneling field effect transistor is an N-type tunneling field effect transistor, the source is heavy doped of P-type ions, the drain is heavy doped of N-type ions, and the tunneling region is heavy doped of N-type ions, light doped of N-type ions, or of no ion doping; or wherein the tunneling field effect transistor is a P-type tunneling field effect transistor, the source is heavy doped of N-type ions, the drain is heavy doped of P-type ions, and the tunneling region is heavy doped of P-type ions, light doped of P-type ions, or of no ion doping.

9. The tunneling field effect transistor according to claim 8, wherein ion doping concentrations of different areas of the tunneling region are the same or not exactly the same; wherein an ion doping concentration of the tunneling region is light doping, heavy doping, or undoping when the ion doping concentrations of the different areas of the tunneling region are the same; and wherein the ion doping concentrations of the different areas are selected from at least two of light doping, heavy doping, and undoping when the ion doping concentrations of the different areas of the tunneling region are not exactly the same.

10. The tunneling field effect transistor according to claim 8, wherein the P-type ions comprise at least one of boron ions, gallium ions, and indium ions and wherein the N-type ions comprise at least one of phosphorus ions and arsenic ions.

11. A preparation method of a tunneling field effect transistor, wherein the method comprises:
    providing a substrate;
    forming, on the substrate, an active region between a source and a drain, wherein the source comprises at least a first area and a second area perpendicularly connected in an "L" shape;
    forming a gate dielectric layer and a gate at least on the second area, wherein the gate is located on a side of the gate dielectric layer deviating from the source; and
    forming, between the gate dielectric layer and the source, a tunneling region in contact with both the gate dielectric layer and the source, wherein the tunneling region is in contact with at least the first area and the second area.

12. The method according to claim 11, wherein both ends of the tunneling region are aligned with both ends of the source.

13. The method according to claim 12, wherein the source comprises the first area and the second area, wherein the second area is in contact with the active region, and wherein forming the active region, the source, the drain, and the tunneling region on the substrate comprises:
    etching the substrate to form an "L"-shaped substrate, wherein the "L"-shaped substrate comprises three parts, wherein a second part is located between a first part and a third part, the first part corresponds to the source to be formed, the second part corresponds to the active region to be formed, and the third part corresponds to the drain to be formed;
    performing ion implantation on the first part to form the source, wherein the source comprises the first area and the second area perpendicularly connected in an "L" shape, and wherein the second area is in contact with the second part;
    after forming the source, forming an epitaxial layer on the "L"-shaped substrate;
    performing ion implantation on the third part and the epitaxial layer located directly over the third part to form the drain;
    after forming the drain, etching to remove the epitaxial layer located directly over the first area, and performing ion implantation or skipping performing ion implantation on the epitaxial layer located directly over the second area to form the tunneling region; and
    forming the active region with the second part and the epitaxial layer located directly over the second part.

14. The method according to claim 12, wherein the source comprises the first area and the second area, wherein the second area is in contact with the active region; and wherein forming the active region, the source, the drain, and the tunneling region on the substrate comprises;
    etching the substrate to form an "L"-shaped substrate, wherein the "L"-shaped substrate comprises three parts, wherein a second part is located between a first part and a third part, the first part corresponds to the source to be formed, the second part corresponds to the active region to be formed, and the third part corresponds to the drain to be formed;
    performing ion implantation on the first part to form the source and an ion implantation region, wherein the source comprises the first area and the second area perpendicularly connected in an "L" shape, the second area is in contact with the second part, and the ion implantation region is in an "L" shape and located on an inner side of the "L"-shaped source;

performing ion implantation on the ion implantation region to form the tunneling region;

after forming the tunneling region, performing ion implantation on the third part to form the drain; and forming the active region with the second part.

15. The method according to claim 12, wherein the source comprises the first area and the second area, wherein the second area is in contact with the active region, and wherein forming the active region, the source, the drain, and the tunneling region on the substrate comprises:

performing ion implantation on the substrate corresponding to the drain to be formed to form the drain;

after forming the drain, etching other parts of the substrate except the drain to form an "L"-shaped substrate, wherein the "L"-shaped substrate comprises two parts, wherein a second part is located between a first part and the drain, the first part corresponds to the source to be formed, and the second part corresponds to the active region to be formed;

performing ion implantation on the first part to form the source, wherein the source comprises the first area and the second area perpendicularly connected in an "L" shape, and the second area is in contact with the second part;

after forming the source, forming an epitaxial layer on the substrate, and etching to remove the epitaxial layer on the first area and the drain;

performing ion implantation or skipping performing ion implantation on the epitaxial layer directly over the second area to form the tunneling region; and forming the active region with the second part and the epitaxial layer located directly over the second part.

16. The method according to claim 12, wherein the source comprises the first area, the second area, and a third area, wherein the third area is in contact with the ac region, and wherein forming the active region, the source, the drain, and the tunneling region on the substrate specifically comprises:

etching the substrate to form a "U"-shaped substrate, wherein the "U"-shaped substrate comprises three parts, wherein a second part is located between a first part and a third part, the first part corresponds to the source to be formed, the second part corresponds to the active region to be formed, and the third part corresponds to the drain to be formed;

performing ion implantation on the first part to form the source, wherein the source comprises the first area, the second area, and the third area, wherein the third area is in contact with the second part, wherein both the first area and the second area and the second area and the third area are all perpendicularly connected in an "L" shape;

after forming the source, forming an epitaxial layer on the "U"-shaped substrate;

performing ion implantation or skipping performing ion implantation on the epitaxial layer located directly over the second area and aligned with the source to form the tunneling region;

after forming the tunneling region, etching to remove the epitaxial layer on the first area of the source, and performing ion implantation on the third part and the epitaxial layer in contact with the third part to form the drain; and forming the active region with the second part and the epitaxial layer corresponding to the second part.

17. The method according to claim 11, wherein a thickness of the tunneling region is less than 10 nanometers (nm).

18. The method according to claim 11, wherein the source is heavy doped of P-type ions, the drain is heavy doped of N-type ions, and the tunneling region is heavy doped of N-type ions, light doped of N-type ions, or of no ion doping when the tunneling field effect transistor is an N-type tunneling field effect transistor; and wherein the source is heavy doped of N-type ions, the drain is heavy doped of P-type ions, and the tunneling region is heavy doped of P-type ions, light doped of P-type ions, or of no ion doping when the tunneling field effect transistor is a P-type tunneling field effect transistor.

19. The method according to claim 18, wherein ion doping concentrations of different areas of the tunneling region are the same or not exactly the same; wherein an ion doping concentration of the tunneling region is light doping, heavy doping, or undoping when the ion doping concentrations of the different areas of the tunneling region are the same; and wherein the ion doping concentrations of the different areas are selected from at least two of light doping, heavy doping, and undoping if the ion doping concentrations of the different areas of the tunneling region are not exactly the same.

20. The method according to claim 18, wherein the P-type ions include at least one of boron ions, gallium ions, and indium ions, and wherein the N-type ions include at least one of phosphorus ions and arsenic ions.

* * * * *